(12) United States Patent
Xu et al.

(10) Patent No.: US 7,334,708 B2
(45) Date of Patent: Feb. 26, 2008

(54) INTEGRAL BLOCKS, CHEMICAL DELIVERY SYSTEMS AND METHODS FOR DELIVERING AN ULTRAPURE CHEMICAL

(75) Inventors: Mindi Xu, Naperville, IL (US); Tay Sayasane, Aurora, IL (US); Joseph E. Paganessi, Burr Ridge, IL (US); Gregory M. Jursich, Clerendon Hills, IL (US); Naoyuki Nakamoto, Himeji (JP); Yukinobu Nishikawa, Yokohama (JP); Herve E. Dulphy, Marseilles (FR); Guillaume Rameau, Grenoble (FR); Lorrin Honda, Oceanside, CA (US)

(73) Assignees: L'Air Liquide, Societe Anonyme A Directoire et Conseil de Surveillance pour l'Etude et l'Exploitation des Procedes Georges Claude, Paris (FR); Air Liquide America Corporation, Houston, TX (US); American Air Liquide, Inc., Fremont, CA (US)

( * ) Notice: Subject to any disclaimer, the term of this patent is extended or adjusted under 35 U.S.C. 154(b) by 756 days.

(21) Appl. No.: 10/064,220

(22) Filed: Jun. 21, 2002

(65) Prior Publication Data
US 2003/0012709 A1      Jan. 16, 2003

Related U.S. Application Data

(60) Provisional application No. 60/305,133, filed on Jul. 16, 2001.

(51) Int. Cl.
*B67D 5/58* (2006.01)
(52) U.S. Cl. .......................... 222/190; 222/61; 222/64; 222/72; 222/135; 222/189.06; 222/152; 222/386.5; 222/394; 222/399

(58) Field of Classification Search .................... 222/1, 222/61, 64, 72, 108, 135, 152, 189.06, 190, 222/386.5, 394, 399
See application file for complete search history.

(56) References Cited

U.S. PATENT DOCUMENTS 5,069,244 A    12/1991  Miyazaki et al.

(Continued)

*Primary Examiner*—Frederick C. Nicolas
(74) *Attorney, Agent, or Firm*—Brandon S. Clark; Christopher J. Cronin

(57) ABSTRACT

Integral blocks, chemical delivery systems and methods for delivering an ultrapure chemical to a point of use or to another integral block are provided. More particularly, the integral blocks include a recharge container block, a pressurization gas block, a purge gas block, a waste recovery block, a vacuum block, a solvent supply block, a degas block, a control block, and a filtration block. Various integral blocks may be selected to form a chemical delivery system, which is particularly suited for a given application. A chemical delivery system will typically comprise a chemical container block, a chemical delivery block, and a point of use in line with the chemical container block and chemical delivery block, as well as one or more integral blocks. The invention also relates to a method for delivering an ultrapure chemical from a chemical container to a point of use, by connecting a chemical container block, containing an ultrapure chemical, to a chemical delivery block and introducing the ultrapure chemical to a point of use. The methods may also include the use of one or more integral blocks. The chemical delivery systems and methods of the invention may be used in a variety of applications. In particular, the invention may be used in electronics fabrication, optical fiber manufacture or semiconductor manufacture.

20 Claims, 21 Drawing Sheets

U.S. PATENT DOCUMENTS

| | | | |
|---|---|---|---|
| 5,148,945 A * | 9/1992 | Geatz | 222/1 |
| 5,360,139 A * | 11/1994 | Goode | 222/40 |
| 5,460,297 A * | 10/1995 | Shannon et al. | 222/135 |
| 5,465,766 A | 11/1995 | Siegele et al. | |
| 5,539,998 A | 7/1996 | Mostowy et al. | |
| 5,607,002 A | 3/1997 | Siegele et al. | |
| 5,964,230 A | 10/1999 | Voloshin et al. | |
| 5,964,254 A | 10/1999 | Jackson | |
| 6,047,744 A | 4/2000 | Jackson | |
| 6,125,876 A * | 10/2000 | Laederich et al. | 137/255 |
| 6,138,691 A | 10/2000 | Voloshin et al. | |
| 6,168,048 B1 * | 1/2001 | Xu et al. | 222/1 |
| 6,199,599 B1 | 3/2001 | Gregg et al. | |
| 6,217,659 B1 | 4/2001 | Botelho et al. | |

* cited by examiner

Filtration Block

INTEGRAL BLOCKS, CHEMICAL DELIVERY SYSTEMS AND METHODS FOR DELIVERING AN ULTRAPURE CHEMICAL

BACKGROUND OF INVENTION

1. Field of Invention

The invention relates to integral blocks, chemical delivery systems and methods for delivering an ultrapure chemical from a chemical container to a point of use. In particular, the invention relates to chemical delivery systems and methods for delivering ultrapure chemicals to manufacturing process tools, such as semiconductor tools and optical fiber manufacture process tools.

2. Background of the Invention

Chemical precursors are used to grow films in the manufacturing process of integrated circuits and optical fiber products. These chemical precursors normally have ultra-high purity levels and are fed from chemical containers to a point of use with chemical delivery systems. The chemicals could be easily contaminated if the delivery lines and those connection points are not properly purged and cleaned. Contaminants include ambient air, particulate matters, and moisture. Contaminants may also include reaction products of chemical precursors and ambient air or moisture. The contaminants may diffuse into the delivery lines from the ambient atmosphere when the lines are not properly protected. Any contaminant will seriously deteriorate the production yields. For example, particulate impurities could change the dielectric property of deposited films and short the conductive connections.

Most of the chemical precursors are delivered in liquid phase to the tools before chemical vapor deposition. Some of the chemicals are in liquid phase themselves at room condition, such as TEOS (tetraethylorthosilicate), or $TiCl4$. Some of the chemicals are in solid phase at low temperature and in liquid phase at an elevated temperature, such as PET (Tantalum Pentaethoxide), and TDMAT (tetrakis-dimethylamino titanium). Often, chemicals in the solid phase, such as BST (barium/strontium/titanate), are dissolved in a suitable solvent before delivery. For a stable and continuous delivery of chemicals, a dual container either in series or in parallel is usually used for delivery. An empty container could be replaced with a full container while another container is still in use. In the process of replacing an empty container, chemicals remaining inside the line and the joints must be cleaned to prevent the residue chemical from contaminating the system, or spilling into the system. Exposure to these chemicals should also be limited, as they are often extremely toxic, or pose a fire hazard or explosion risk. Another reason to clean the residual chemical is that the residuals of most precursor chemicals mentioned above will react with air and moisture. The reaction products will contaminant the delivery system and further the chemicals to be delivered. Some of the chemical may also react with air and moisture to produce solid that is very difficult to be removed. In this case, the delivery line could be blocked, resulting in discontinuation of delivery.

Therefore, when the joints of chemical container and delivery lines are disconnected, the lines must be protected from intrusion of ambient contaminates. The method to protect the lines from such an intrusion is to bleed an inert gas out of the broken joints to blank the opening. Therefore, blocking inert gas must be provided to the delivery system. After the replacement of chemical container, the lines must also be cleaned and purged with inert gas, vacuum, and in some cases with liquid solvent alternatively to assure the lines including the joints with chemical containers contaminants free.

Chemicals are usually delivered by pressurizing the chemicals with an inert gas through a manifold. When purge gas and liquid solvent are needed for system purge, a different design of manifold is commonly used. The design and operation of a delivery system vary, depending upon chemical properties. The operator has to deal with various delivery systems with different design and operation procedures. Therefore, it is not cost effective for a fab to use such delivery systems for multiple chemical precursors. Further, some necessary functions, such as bleeding gas for blanking an open joint after disconnecting a chemical container from the delivery system manifold, may not be properly arranged or may be completely ignored.

With dual or multiple containers in a parallel arrangement, the alternate usage of two or more containers indeed meets the chemical demands of process tools. It has been realized that the delivery manifold and corresponding control are more complicated than a single changeable container system. It also requires a multiple arrangement for supplying purge gas and liquid solvent. Therefore, more components such as valves and connection fittings are needed for such a delivery system. In addition, the chance for contamination of the delivery system increases because more joints need to be disconnected while replacing the empty containers.

Chemicals could have particles at rather high concentrations if the chemicals are not filtered. These particles may originate from chemical manufacturing process, chemical packaging, and transportation. Particles are contaminants and must be removed from chemicals in order to maintain chemical delivery system functioning properly and eventually high production yields of IP and optical fiber manufacture. Although there is a need to remove particles from chemicals, there are presently no satisfactory methods for doing so, because of a lack in a proper design to integrate a filtration arrangement into a chemical precursor delivery system.

In most chemical delivery systems, a relative expensive inert gas such as helium is used as the pressurization gas. In many existing chemical delivery systems, residue chemicals inside the manifold connections are purged with a same gas source as pressurization gas. Since the pressurization gas is expensive, usage of such a gas for purge purpose will increase the operation cost. Also, leakage of helium gas into the ambient atmosphere may induce operation concerns for other operation procedures. For example, chemical delivery systems or even other similar material-supplying systems need to be checked for leaking of helium from time to time. An unexpected high concentration from surrounding chemical system purge will mislead the leak check operation.

Accordingly, what is needed in the art are integral blocks and chemical delivery systems designed for delivering chemical precursors from chemical containers to a point of use. The point of use is preferably a tool for chemical vapor film deposition. In addition, the chemical delivery system would have the flexibility to easily add other function blocks. Thus, what is needed is integral blocks that can be added into the basic delivery system for various chemical delivery needs. This invention answers this need.

SUMMARY OF INVENTION

The invention relates to integral blocks used for chemical delivery, methods for chemical delivery, as well as universal or basic chemical delivery systems with various integral blocks for the delivery of different chemicals and system cleaning purposes. Preferably, the invention provides chemical delivery systems for delivering chemical precursors from chemical containers to a point of use, such as tools for chemical vapor film deposition while having the flexibility to easily add other function blocks.

In particular, the invention relates to a solvent supply block to supply solvent for purge; a purge gas block to supply gas for purge; a waste recovery block to receive chemical waste from chemical delivery system; a degas block to remove dissolved gas in chemicals to assure chemical flow and quality; a filtration block to remove particles from chemicals; and a control block consisting of the necessary computer system or PLC to receive and send signals for automatic control. Each block can be added into the basic delivery system for various chemical delivering needs.

With such a system, for instance, chemical delivery for high vapor pressure chemicals could be fulfilled with a basic system at a low cost. Chemical delivery with any special need such as solvent flush cleaning could be done with the basic delivery system by adding solvent supplying block. Many other integral blocks as supplement to the basic system could be added for other purposes, such as waste chemical recovery, chemical filtration, degassing, etc. Any add-on of different integral blocks may not change the overall design of the basic system and other function blocks. The individual block could function independently for chemical delivery requirement.

In one aspect, the invention relates to an integral block, connectable to a chemical delivery system for delivering an ultrapure chemical from a liquid chemical container to a point of use in a semiconductor or a fiber optical manufacturing process, wherein said integral block is a chemical container block for containing an ultrapure chemical, a recharge container block for recharging a container, a pressurization gas block for providing pressure, a purge gas block for purging a chemical or contaminant, a waste recovery block for waste recovery, a vacuum block for creating a vacuum, a solvent supply block for supplying a solvent, a degas block for degassing a chemical, a filtration block for filtering a chemical or combinations thereof, wherein the integral block is prefabricated.

The chemical container block comprises: (i) a first chemical container connection joint adapted to be attached to a pressurized gas source; (ii) a sealed chemical container; (iii) a second chemical container connection joint adapted to be attached to an integral block; (iv) a chemical container inlet conduit connected between the first chemical container connection joint and the sealed chemical container to deliver a pressurized gas to the sealed chemical container; (v) a chemical container delivery conduit connected between the sealed chemical container and the second chemical container connection joint, to deliver an ultrapure chemical to a point of use or an integral block, (vi) a chemical container bypass conduit connected between the chemical container inlet conduit and the chemical container delivery conduit, (vii) optionally, a chemical container discharge conduit connected in line with the chemical container inlet conduit or the chemical container delivery conduit, and (viii) a chemical container level indicator for monitoring the level in the sealed chemical container. The chemical container inlet conduit comprises: a first chemical container joint adapted for the removal of the sealed container, and a first chemical container isolation valve connected between the first connection joint and the sealed container, and wherein the chemical container delivery conduit comprises: a chemical container diptube with a first end extending into the sealed chemical container, a second chemical container isolation valve connected between the second chemical container connection joint and the sealed chemical container, and a second chemical container joint adapted for the removal of the sealed chemical container, connected between the second chemical container connection joint and the sealed chemical container. The chemical container discharge conduit comprises: a fifth chemical container connection joint, and a chemical container control valve connected in line with the fifth chemical container connection joint and the chemical container inlet conduit or the chemical container delivery conduit.

The recharge container block comprises: (i) a first recharge container connection joint adapted to be attached to an integral block, (ii) a sealed recharge container, (iii) a recharge container chemical inlet conduit connected between the first recharge container connection joint and sealed recharge container to deliver an ultrapure chemical to the sealed recharge container, (iv) a second recharge container connection joint adapted to be attached to an integral block, (v) a gas conduit connected between the second recharge container connection joint and sealed recharge container to deliver a pressurized gas to the sealed recharge container, (vi) a third recharge container connection joint adapted to be attached to an integral block, (vii) a recharge container chemical delivery conduit connected between the third recharge container connection joint and sealed recharge container to deliver chemicals to a point of use or an integral block, and (viii) a recharge container level monitor for monitoring the level in the sealed recharge container. The recharge container chemical inlet conduit comprises: a first recharge container control valve connected between the first recharge container connection joint and the sealed recharge container, a first recharge container joint connected between the first recharge container connection joint and the sealed recharge container, and a first recharge container isolation valve connected between the first recharge container connection joint and the sealed recharge container. The gas conduit comprises a fourth recharge container connection joint adapted to be attached to an integral block, connected between the second recharge container connection joint and the sealed recharge container, a needle valve connected between the second recharge container connection joint and the sealed recharge container, a second control valve connected between the second recharge container connection joint and the sealed recharge container, a second recharge container joint connected between the second recharge container connection joint and the sealed recharge container, and a second recharge container isolation valve connected between the second recharge container connection joint and the sealed recharge container. The recharge container chemical delivery conduit comprises: a third recharge container control valve connected between the third connection joint and the sealed container, a third recharge container joint adapted for the removal of the sealed container, connected between the third connection joint and the sealed container, a third recharge container isolation valve connected between the third recharge container connection joint and the sealed recharge container, a fourth recharge container isolation valve connected between the third recharge container connection joint and the sealed recharge container, a port connected between the third recharge container connection joint and the sealed recharge container, and a diptube with a first end extending into the sealed recharge container and in line with the recharge container chemical delivery conduit.

The pressurization gas block comprises: (i) a first pressurization gas block connection joint adapted to receive an inert gas; (ii) at least one pressurization gas block gas conduit; (iii) a pressurization gas block isolation valve connected between said first pressurization gas block connection joint and said pressurization gas block gas conduit; (iv) a pressurization gas block regulator connected between said first pressurization gas block connection joint and said pressurization gas block gas conduit; (v) a pressurization gas block filter connected between said first pressurization gas block connection joint and said pressurization gas block gas conduit; (vi) a first pressurization gas block pressure sensor connected between said first pressurization gas block connection joint and said pressurization gas block gas conduit, and (vii) a pressurization gas block check valve connected between said first pressurization gas block connection joint and said pressurization gas block gas conduit. The at least one pressurization gas block gas conduit comprises: a second pressurization gas block connection joint adapted to be attached to an integral block, a pressurization gas block needle valve optionally connected between said second pressurization gas block connection joint and said check valve, a pressurization gas block control valve connected between said second pressurization gas block connection joint and said pressurization gas block check valve, and a second pressurization gas block pressure sensor connected between said second pressurization gas block connection joint and said pressurization gas block check valve.

The purge gas block comprises: (i) a first purge gas connection joint adapted to be connected to a first integral block, (ii) at least one purge gas conduit, (iii) an purge gas isolation valve connected between the first purge gas connection joint and purge gas conduit, (iv) a pressure regulator connected between the first purge gas connection joint and purge gas conduit, (v) a purge gas filter connected between the first purge gas connection joint and purge gas conduit, (vi) a purge gas control valve connected between the first purge gas connection joint and purge gas conduit, (vii) a purge gas check valve connected between the first purge gas connection joint and purge gas conduit, (viii) a purge gas pressure sensor connected between the first purge gas connection joint and purge gas conduit, and (ix) a purge gas flow restriction orifice connected around the purge gas control valve. The purge gas conduit comprises: at least one second purge gas connection joint adapted to be connected to a second purge gas integral block, and at least one purge gas control valve, connected between the first purge gas connection joint and the second purge gas connection joint.

The waste recovery block comprises: (i) a first waste recovery connection joint adapted to receive waste from at least one integral block, (ii) a sealed waste recovery container, (iii) a waste recovery inlet connected between the sealed waste recovery container and the first waste recovery connection joint, (iv) a second waste recovery connection joint adapted to be attached to an integral block, (v) a waste exhaust connected between the sealed waste recovery container and the second waste recovery connection joint, (vi) a first waste recovery control valve connected between the waste inlet and the waste exhaust, and (vii) a waste recovery level indicator for monitoring the level in the sealed waste recovery container. The waste inlet comprises a second waste recovery control valve connected between the first waste recovery connection joint and the sealed waste recovery container, a first waste recovery container joint connected between the first waste recovery connection joint and the sealed waste recovery container, and a first waste recovery isolation valve connected between the first waste recovery connection joint and the sealed waste recovery container. The waste exhaust comprises a second waste recovery isolation valve connected between the second waste recovery connection joint and the sealed waste recovery container, a second waste recovery container joint connected between the second waste recovery connection joint and the sealed waste recovery container, and a third waste recovery control valve connected between the second waste recovery connection joint and the sealed waste recovery container.

The vacuum block comprises: (i) a vacuum generator, (ii) a first vacuum block control valve in line with the vacuum generator, and (iii) at least one vacuum conduit adapted to provide a vacuum and in line with the vacuum generator. The vacuum conduit comprises a vacuum block connection joint adapted to be attached to at least one integral block, and a second vacuum block control valve connected between the connection joint and the vacuum generator.

The solvent supply block comprises: (i) a first solvent supply connection joint adapted to be connected to a first integral block, (ii) a sealed solvent supply container, (iii) a pressurization solvent supply gas inlet connected between the first solvent supply connection joint and the sealed container, (iv) a second solvent supply connection joint adapted to be connected to a second integral block, (v) a solvent supply delivery outlet connected between the second connection joint and the sealed container, (vi) a solvent supply control valve connected between the solvent supply pressurization gas inlet and the solvent supply delivery outlet, and (vii) a solvent supply level indicator for monitoring the level in the sealed container. The pressurization gas inlet comprises: a first solvent supply container joint connected between the first connection joint and the sealed container, a second control solvent supply valve connected between the first solvent supply connection joint and the sealed solvent supply container, and a first solvent supply isolation valve connected between the first solvent supply connection joint and the sealed solvent supply container. The solvent supply delivery outlet comprises: a solvent supply diptube with one end extending into the sealed container, a second solvent supply isolation valve connected between sealed solvent supply container and the second solvent supply connection joint, a second solvent supply container joint connected between sealed solvent supply container and the second solvent supply connection joint, a third solvent supply control valve connected between sealed solvent supply container and the second solvent supply connection joint, and a fourth solvent supply control valve connected between sealed solvent supply container and the second solvent supply connection joint.

The degas block comprises: (i) a first degas block connection joint adapted to be attached to an integral block; (ii) a second degas block connection joint adapted to be attached to an integral block; (iii) a degas block chemical inlet conduit comprising a first degas block isolation valve and connected between the first degas block connection joint and the second degas block connection joint, (iv) a membrane cartridge connected between the first degas block connection joint and the second degas block connection joint, (v) a degas block chemical outlet conduit comprising a second degas block isolation valve and connected between the first degas block connection joint and the second degas block connection joint, and (vi) a degas block control valve connected between the membrane cartridge and the second degas block connection joint.

The filtration block comprises: (i) a first filtration block connection joint adapted to be connected to a first integral block, (ii) a second filtration block connection joint adapted to be connected to a second integral block, and (iii) at least one filtration conduit connected between the first filtration block connection joint and the second filtration block connection joint. The filtration conduit comprises: a first filtration block isolation valve connected between the first filtration block connection joint and the second filtration block connection joint, a filter connected between the first filtration block connection joint and the second filtration block connection joint, and a second filtration block isolation valve connected between the first filtration block connection joint and the second filtration block connection joint.

In a preferred aspect of the invention, the point of use is a vaporizer or a tool for chemical vapor deposition.

In another preferred aspect, the integral block is a chemical container block for delivering an ultrapure chemical to a point of use or to a second integral block, a recharge container block, for receiving chemicals from a chemical container block and delivering chemicals to a point of use or a second integral block, a pressurization gas block, a purge gas block, a waste recovery block, a vacuum block, for providing a vacuum to one or more integral blocks, a solvent supply block, a degas block, for removing dissolved gas in an ultrapure chemical, or a filtration block for removing particles from an ultrapure chemical.

In another preferred aspect of the invention, the integral block is a pressurization gas block, further comprising an additional gas conduit comprising: a third pressurization gas connection joint adapted to be attached to an integral block, and a second pressurization gas control valve connected between said second connection joint and said check valve.

In another preferred aspect of the invention, the integral block is a vacuum block, wherein the vacuum generator is a venturi or a vacuum pump.

In yet another aspect, the invention relates to a chemical delivery system for delivering an ultrapure chemical from a chemical container to a point of use, comprising: (i) a chemical container block as described above; (ii) a chemical delivery block in line with the chemical container block, and (iii) a point of use in line with the chemical container block and the chemical delivery block. The chemical delivery block may be any block that delivers a chemical and/or solvent. Preferably, the chemical delivery block is a pressurization gas block as described above.

In a preferred aspect, the chemical delivery system further comprising at least one integral block. The least one integral block may be selected from a recharge container block, a pressurization gas block, a purge gas block, a waste recovery block, a vacuum block, a solvent supply block, a degas block, or a filtration block.

In a preferred aspect, the point of use for the chemical delivery system is a vaporizer, a manufacturing process tool, an electronic fabrication tool, an optical fiber manufacture tool, or a semiconductor process tool.

In a preferred aspect, the invention relates to a chemical delivery system for delivering an ultrapure chemical from a liquid chemical container to a point of use in a semiconductor or a fiber optical manufacturing process, comprising a prefabricated chemical container block for containing an ultrapure chemical, a prefabricated recharge container block for recharging a container, a prefabricated pressurization gas block for providing pressure, a prefabricated purge gas block for purging a chemical, a prefabricated waste recovery block for waste recovery, a prefabricated vacuum block for creating a vacuum, a prefabricated solvent supply block for supplying a solvent, a prefabricated degas block for degassing a chemical, and a prefabricated filtration block for filtering a chemical.

The prefabricated chemical container block comprises: (i) a first chemical container connection joint adapted to be attached to a pressurized gas source; (ii) a sealed chemical container; (iii) a second chemical container connection joint adapted to be attached to an integral block; (iv) a chemical container inlet conduit connected between the first chemical container connection joint and the sealed chemical container to deliver a pressurized gas to the sealed chemical container; (v) a chemical container delivery conduit connected between the sealed chemical container and the second chemical container connection joint, to deliver an ultrapure chemical to a point of use or an integral block, (vi) a chemical container bypass conduit connected between the chemical container inlet conduit and the chemical container delivery conduit, (vii) optionally, a chemical container discharge conduit connected in line with the chemical container inlet conduit or the chemical container delivery conduit, and (viii) a chemical container level indicator for monitoring the level in the sealed chemical container. The chemical container inlet conduit comprises: a first chemical container joint adapted for the removal of the sealed container, and a first chemical container isolation valve connected between the first connection joint and the sealed container. The chemical container delivery conduit comprises: a chemical container diptube with a first end extending into the sealed chemical container, a second chemical container isolation valve connected between the second chemical container connection joint and the sealed chemical container, and a second chemical container joint adapted for the removal of the sealed chemical container, connected between the second chemical container connection joint and the sealed chemical container. The chemical container discharge conduit comprises: a fifth chemical container connection joint, and a chemical container control valve connected in line with the fifth chemical container connection joint and the chemical container inlet conduit or the chemical container delivery conduit.

The prefabricated recharge container block comprises: (i) a first recharge container connection joint adapted to be attached to an integral block, (ii) a sealed recharge container, (iii) a recharge container chemical inlet conduit connected between the first recharge container connection joint and sealed recharge container to deliver an ultrapure chemical to the sealed recharge container, (iv) a second recharge container connection joint adapted to be attached to an integral block, (v) a gas conduit connected between the second recharge container connection joint and sealed recharge container to deliver a pressurized gas to the sealed recharge container, (vi) a third recharge container connection joint adapted to be attached to an integral block, (vii) a recharge container chemical delivery conduit connected between the third recharge container connection joint and sealed recharge container to deliver chemicals to a point of use or an integral block, and (viii) a recharge container level monitor for monitoring the level in the sealed recharge container. The prefabricated recharge container chemical inlet conduit comprises: a first recharge container control valve connected between the first recharge container connection joint and the sealed recharge container, a first recharge container joint connected between the first recharge container connection joint and the sealed recharge container, and a first recharge container isolation valve connected between the first recharge container connection joint and the sealed recharge container. The prefabricated gas conduit comprises: a fourth recharge container connection joint adapted to be attached to an integral block, connected between the second recharge container connection joint and the sealed recharge container, a needle valve connected between the second recharge container connection joint and the sealed recharge container, a second control valve connected between the second recharge container connection joint and the sealed recharge container, a second recharge container joint connected between the second recharge container connection joint and the sealed recharge container, and a second recharge container isolation valve connected between the second recharge container connection joint and the sealed recharge container. The recharge container chemical delivery conduit comprises: a third recharge container control valve connected between the third connection joint and the sealed container, a third recharge container joint adapted for the removal of the sealed container, connected between the third connection joint and the sealed container, a third recharge container isolation valve connected between the third recharge container connection joint and the sealed recharge container, a fourth recharge container isolation valve connected between the third recharge container connection joint and the sealed recharge container, a port connected between the third recharge container connection joint and the sealed recharge container, and a diptube with a first end extending into the sealed recharge container and in line with the recharge container chemical delivery conduit.

The prefabricated pressurization gas block comprises: (i) a first pressurization gas block connection joint adapted to receive an inert gas; (ii) at least one pressurization gas block gas conduit; (iii) a pressurization gas block isolation valve connected between said first pressurization gas block connection joint and said pressurization gas block gas conduit; (iv) a pressurization gas block regulator connected between said first pressurization gas block connection joint and said pressurization gas block gas conduit; (v) a pressurization gas block filter connected between said first pressurization gas block connection joint and said pressurization gas block gas conduit; (vi) a first pressurization gas block pressure sensor connected between said first pressurization gas block connection joint and said pressurization gas block gas conduit, and (vii) a pressurization gas block check valve connected between said first pressurization gas block connection joint and said pressurization gas block gas conduit. The at least one pressurization gas block gas conduit comprises: a second pressurization gas block connection joint adapted to be attached to an integral block, a pressurization gas block needle valve optionally connected between said second pressurization gas block connection joint and said check valve, a pressurization gas block control valve connected between said second pressurization gas block connection joint and said pressurization gas block check valve, and a second pressurization gas block pressure sensor connected between said second pressurization gas block connection joint and said pressurization gas block check valve.

The prefabricated purge gas block comprises: (i) a first purge gas connection joint adapted to be connected to a first integral block, (ii) at least one purge gas conduit, (iii) an purge gas isolation valve connected between the first purge gas connection joint and purge gas conduit, (iv) a pressure regulator connected between the first purge gas connection joint and purge gas conduit, (v) a purge gas filter connected between the first purge gas connection joint and purge gas conduit, (vi) a purge gas control valve connected between the first purge gas connection joint and purge gas conduit, (vii) a purge gas check valve connected between the first purge gas connection joint and purge gas conduit, (viii) a purge gas pressure sensor connected between the first purge gas connection joint and purge gas conduit, and (ix) a purge gas flow restriction orifice connected around the purge gas control valve. The purge gas conduit comprises: at least one second purge gas connection joint adapted to be connected to a second purge gas integral block, and at least one purge gas control valve, connected between the first purge gas connection joint and the second purge gas connection joint.

The prefabricated waste recovery block comprises: (i) a first waste recovery connection joint adapted to receive waste from at least one integral block, (ii) a sealed waste recovery container, (iii) a waste recovery inlet connected between the sealed waste recovery container and the first waste recovery connection joint, (iv) a second waste recovery connection joint adapted to be attached to an integral block, (v) a waste exhaust connected between the sealed waste recovery container and the second waste recovery connection joint, (vi) a first waste recovery control valve connected between the waste inlet and the waste exhaust, and (vii) a waste recovery level indicator for monitoring the level in the sealed waste recovery container. The waste inlet comprises: a second waste recovery control valve connected between the first waste recovery connection joint and the sealed waste recovery container, a first waste recovery container joint connected between the first waste recovery connection joint and the sealed waste recovery container, and a first waste recovery isolation valve connected between the first waste recovery connection joint and the sealed waste recovery container. The waste exhaust comprises: a second waste recovery isolation valve connected between the second waste recovery connection joint and the sealed waste recovery container, a second waste recovery container joint connected between the second waste recovery connection joint and the sealed waste recovery container, and a third waste recovery control valve connected between the second waste recovery connection joint and the sealed waste recovery container.

The prefabricated vacuum block comprises: (i) a vacuum generator, (ii) a first vacuum block control valve in line with the vacuum generator, and (iii) at least one vacuum conduit adapted to provide a vacuum and in line with the vacuum generator. The vacuum conduit comprises a vacuum block connection joint adapted to be attached to at least one integral block, and a second vacuum block control valve connected between the connection joint and the vacuum generator.

The prefabricated solvent supply block comprises: (i) a first solvent supply connection joint adapted to be connected to a first integral block, (ii) a sealed solvent supply container, (iii) a pressurization solvent supply gas inlet connected between the first solvent supply connection joint and the sealed container, (iv) a second solvent supply connection joint adapted to be connected to a second integral block, (v) a solvent supply delivery outlet connected between the second connection joint and the sealed container, (vi) a solvent supply control valve connected between the solvent supply pressurization gas inlet and the solvent supply delivery outlet, and (vii) a solvent supply level indicator for monitoring the level in the sealed container. The pressurization gas inlet comprises: a first solvent supply container joint connected between the first connection joint and the sealed container, a second control solvent supply valve connected between the first solvent supply connection joint and the sealed solvent supply container, and a first solvent supply isolation valve connected between the first solvent supply connection joint and the sealed solvent supply container. The solvent supply delivery outlet comprises: a solvent supply diptube with one end extending into the sealed container, a second solvent supply isolation valve connected between sealed solvent supply container and the second solvent supply connection joint, a second solvent supply container joint connected between sealed solvent supply container and the second solvent supply connection joint, a third solvent supply control valve connected between sealed solvent supply container and the second solvent supply connection joint, and a fourth solvent supply control valve connected between sealed solvent supply container and the second solvent supply connection joint.

The prefabricated degas block comprises: (i) a first degas block connection joint adapted to be attached to an integral block; (ii) a second degas block connection joint adapted to be attached to an integral block; (iii) a degas block chemical inlet conduit comprising a first degas block isolation valve and connected between the first degas block connection joint and the second degas block connection joint, (iv) a membrane cartridge connected between the first degas block connection joint and the second degas block connection joint, (v) a degas block chemical outlet conduit comprising a second degas block isolation valve and connected between the first degas block connection joint and the second degas block connection joint, and (vi) a degas block control valve connected between the membrane cartridge and the second degas block connection joint.

The prefabricated filtration block comprises: (i) a first filtration block connection joint adapted to be connected to a first integral block, (ii) a second filtration block connection joint adapted to be connected to a second integral block, and (iii) at least one filtration conduit connected between the first filtration block connection joint and the second filtration block connection joint. The filtration conduit comprises: a first filtration block isolation valve connected between the first filtration block connection joint and the second filtration block connection joint, a filter connected between the first filtration block connection joint and the second filtration block connection joint, and a second filtration block isolation valve connected between the first filtration block connection joint and the second filtration block connection joint.

In a preferred aspect, the point of use for the chemical delivery system is a vaporizer, a manufacturing process tool, an electronic fabrication tool, an optical fiber manufacture tool, or a semiconductor process tool.

In yet another aspect, the invention relates to a method for delivering an ultrapure chemical to a point of use, which comprises: (i) connecting a chemical container block containing an ultrapure chemical to a chemical delivery block; and (ii) introducing the ultrapure chemical to a point of use. The method may further comprise connecting at least one integral block to said chemical delivery system. The integral block may be selected from a recharge container block, a pressurization gas block, a purge gas block, a waste recovery block, a vacuum block, a solvent supply block, a degas block, a control block, or a filtration block. Preferably, the integral block is a solvent supply block or a recharge container block, and further comprising the step of delivering a solvent to an integral block prior to introducing the ultrapure chemical to a point of use. The solvent may preferably be selected from the group consisting of: isopropanol, tetrahydrofuran, isopropanol/tetrahydrofuran mixtures, tetraglyme, xylene, toluene, butyl acetate, benzonitrile, ethanol, hexane, octane, or mixtures thereof.

In a preferred aspect, the point of use for these methods is a vaporizer, a manufacturing process tool, an electronic fabrication tool, an optical fiber manufacture tool, or a semiconductor process tool.

Preferred ultrapure chemicals for use with the integral blocks, systems, and methods of the invention include, but are not limited to, tetramethylsilane, dimethyl-dimethoxysilane, copper(II)bis(hexafluoroacetylacetonate), copper(II) hexafluoroacetylacetonate tetramethylvinylsilane, triisobutylaluminum, trimethylaminalane, triethylaminalane, dimethylethylaminalane, bis(trimethylamin) alane, dimethylaluminumhydride, titanium tetrachloride, tetrakisdimethylaminotitanium (TDMAT), tetra-kisdiethylamino tantalum (Ta(Net)$_4$), penta-kisdiethylamino tantalum (Ta(Net)$_5$), tantalum pentachloride (TaCl$_5$), tungstenhexocarbonyl (W(CO)$_6$), bisdipivaloylmethanato barium (Ba(DPM)$_2$) bisdipivaloylmethanato strontium (Sr(DPM)$_2$), bis-isopropoxybisdipivaloylmethanato titanium Ti(I-OC$_3$H$_7$)$_2$DPM$_2$, trimethylaluminum (TMA), tetrakisdimethylamino zirconium (Zr(NME)$_4$), tetrakisdiethylamino zirconium(Zr(Net)$_4$), zirconium t-Butoxide (Zr(t-OBu)$_4$, tetrakisdiethylamino hafnium(Hf(Net)$_4$), tetrakisdimethylamino hafnium (Hf(NME)$_4$), hafnium t-Butoxide(Hf(t-Obu)$_4$), trihexafluoroacetylacetate platinum (Pt(Hfa)$_3$), bis(ethylcyclopentadienyl) ruthenium (EtCp$_2$Ru), acetylacetate iridium(Ir(Acac)), dipivaloylmethane compounds, alkoxide compounds, bisdipivaloylmethanato lead (Pb(DPM)$_2$), bis-dipivaloylmethanato zirconium(Zr(DPM)$_4$), trimethyl bismuth (BiMe$_3$), tetraethylorthosilicate (TEOS), tantalum pentaethoxide (Ta(OEt)$_5$), tetramethylcyclotetrasiloxane (TMCTS), bis (tertiary-butylamino)silane (BTBAS), trimethylphosphate (TMPO), trimethylborate (TMB), or trimethylphosphite (TMPI).

Other objects and aspects of the present invention will become apparent to one of ordinary skill in the art on a review of the specification, drawings and claims appended hereto.

BRIEF DESCRIPTION OF DRAWINGS

The objects and advantages of the invention will become apparent from the following detailed description of the preferred embodiments thereof in connection with the accompanying drawings, in which.

DETAILED DESCRIPTION

Figure 1:
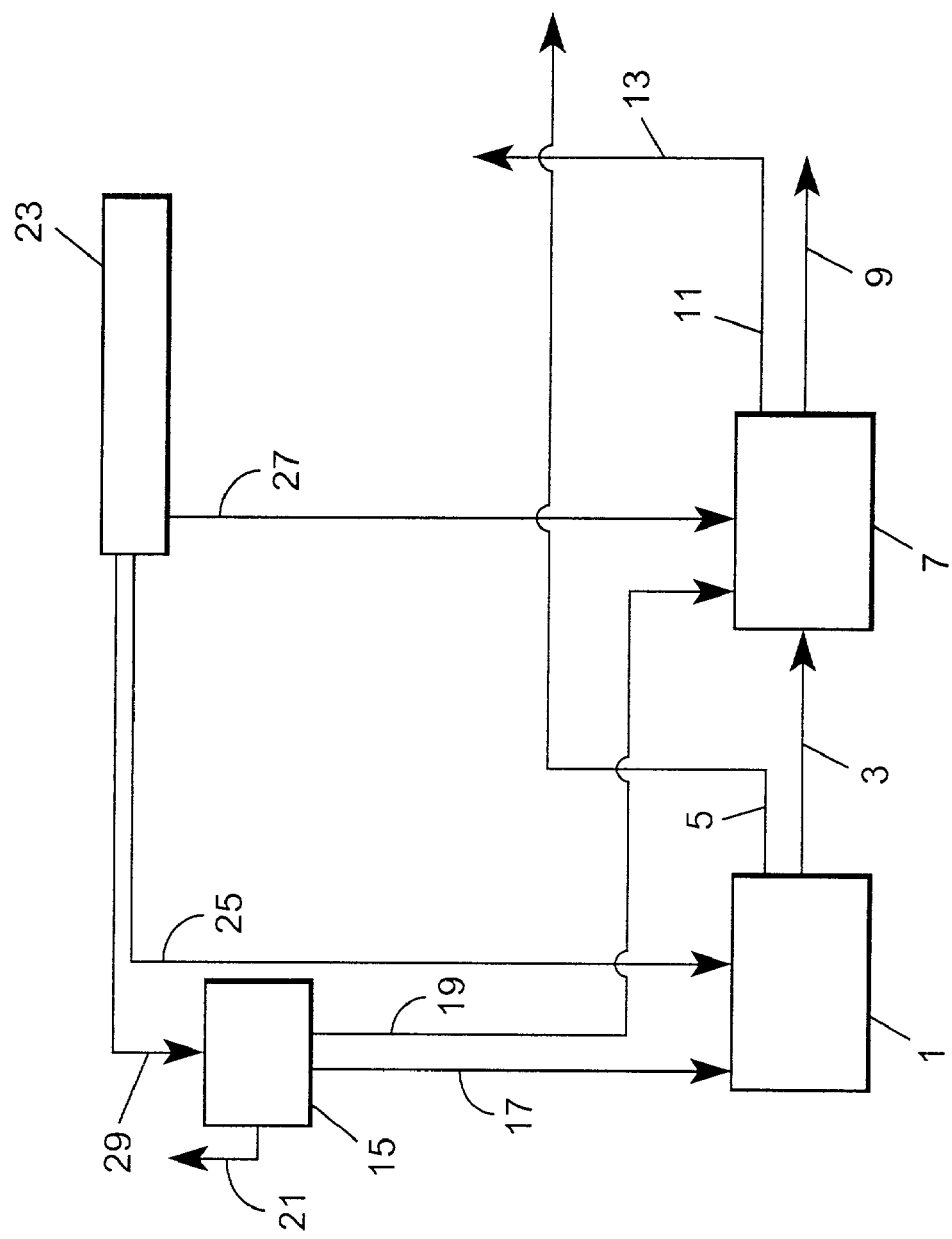
FIG. 1 is a schematic diagram of chemical delivery system with the basic blocks.

The invention relates to chemical delivery systems and methods for delivering ultrapure chemicals. In particular, the invention relates to chemical delivery systems and methods for delivering ultrapure chemicals from one or more chemical containers to a point of use, such as semiconductor and optical fiber manufacture process tools.

"Ultrapure chemical" or "chemical precursors" are used in a variety of applications, such as chemical vapor deposition. A variety of chemical precursors have been used for chemical vapor deposition in the integrated circuits and other manufacturing processes, such as optical fiber manufacturing. The chemical precursors include those for metal interconnects, barrier metal films, gate films, oxide films, and interlayer dielectric films, such as trimethylsilane, tetramethylsilane, or dimethyl-dimethoxy-silane, copper(II)bis (hexafluoroacetylacetonate), copper(II)hexafluoroacetylacetonate tetramethylvinylsilane, triisobutylaluminum, trimethylaminalane, triethylaminalane, dimethylethylaminalane, bis(trimethylamin)alane, or dimethylaluminumhydride, titanium tetrachloride, tetrakisdimethylaminotitanium (TDMAT), tetra- or penta-kisdiethylamino tantalum (Ta(Net)$_4$/Ta(Net)$_5$), tantalum pentachloride (TaCl$_5$), or tungstenhexocarbonyl (W(CO)$_6$), bisdipivaloylmethanato barium (Ba(DPM)$_2$), bisdipivaloylmethanato strontium (Sr(DPM)$_2$), bis-isopropoxybisdipivaloylmethanato titanium Ti(I-OC$_3$H$_7$)$_2$DPM$_2$, trimethylaluminum (TMA), tetrakisdimethylamino zirconium (Zr(NME)$_4$), tetrakisdiethylamino zirconium(Zr(Net)$_4$), zirconium t-Butoxide (Zr(t-OBu)$_4$, tetrakisdiethylamino hafnium(Hf(Net)$_4$), tetrakisdimethylamino hafnium (Hf(NME)$_4$), hafnium t-Butoxide(Hf(t-Obu)$_4$), trihexafluoroacetylacetate platinum (Pt(Hfa)$_3$), bis(ethylcyclopentadienyl) ruthenium (EtCp2Ru), acetylacetate iridium(Ir(Acac)), other dipivaloylmethane and alkoxide compounds, bisdipivaloylmethanato lead (Pb(DPM)$_2$), bisdipivaloylmethanato zirconium(Zr(DPM)$_4$), trimethyl bismuth (BiMe$_3$), or, tetraethylorthosilicate (TEOS), tantalum pentaethoxide (Ta(OEt)$_5$), tetramethylcyclotetrasiloxane (TMCTS), bis (tertiary-butylamino)silane (BTBAS), trimethylphosphate (TMPO), trimethylborate (TMB), or trimethylphosphite (TMPI).

The chemical precursors that are used to grow thin films on substrates are usually in either liquid or solid state at room temperature and pressure, and some are in gaseous state at room condition but change to liquid state under a higher pressure or a lower temperature.

The chemical precursors in their liquid states usually are utilized directly to produce chemical vapors for CVD deposition. The precursors in their solid states are usually dissolved into solvent to form liquids first, which is then used for producing chemical vapors. The solvents used for preparing such liquid solutions include isopropanol, tetrahydrofuran, isopropanol/tetrahydrofuran mixtures, tetraglyme, xylene, toluene, butyl acetate, benzonitrile, and like. A particular solvent for a particular precursor could be selected based on the physical and chemical properties of precursors by those skilled in the arts. Also based on a particular case, the precursors normally in their liquid states can be mixed with a solvent to form a solution prior to their use for film deposition. The liquid solutions of chemical precursors are supplied from a source container block to user tools directly or though a series of chemical delivery blocks.

Each integral block stands alone and functions independently in a delivery system of various combinations of blocks. One embodiment of the invention relates to chemical delivery systems and methods using various integral blocks for different needs of chemical delivery. The chemical delivery systems are constructed easily using a variety of chemical delivery blocks based on various delivery requirements as shown in FIGS. 1 to 7.

For example, a basic delivery system could be a combination of the pressurization gas block and the chemical container block. A combination of pressurization gas block, chemical container block, and solvent supply block could be another preferred delivery system for chemicals that require solvent cleaning and purge. Either of the filtration block and the degassing block could be combined with pressurization block and chemical container block for a delivery system.

Figure 8:
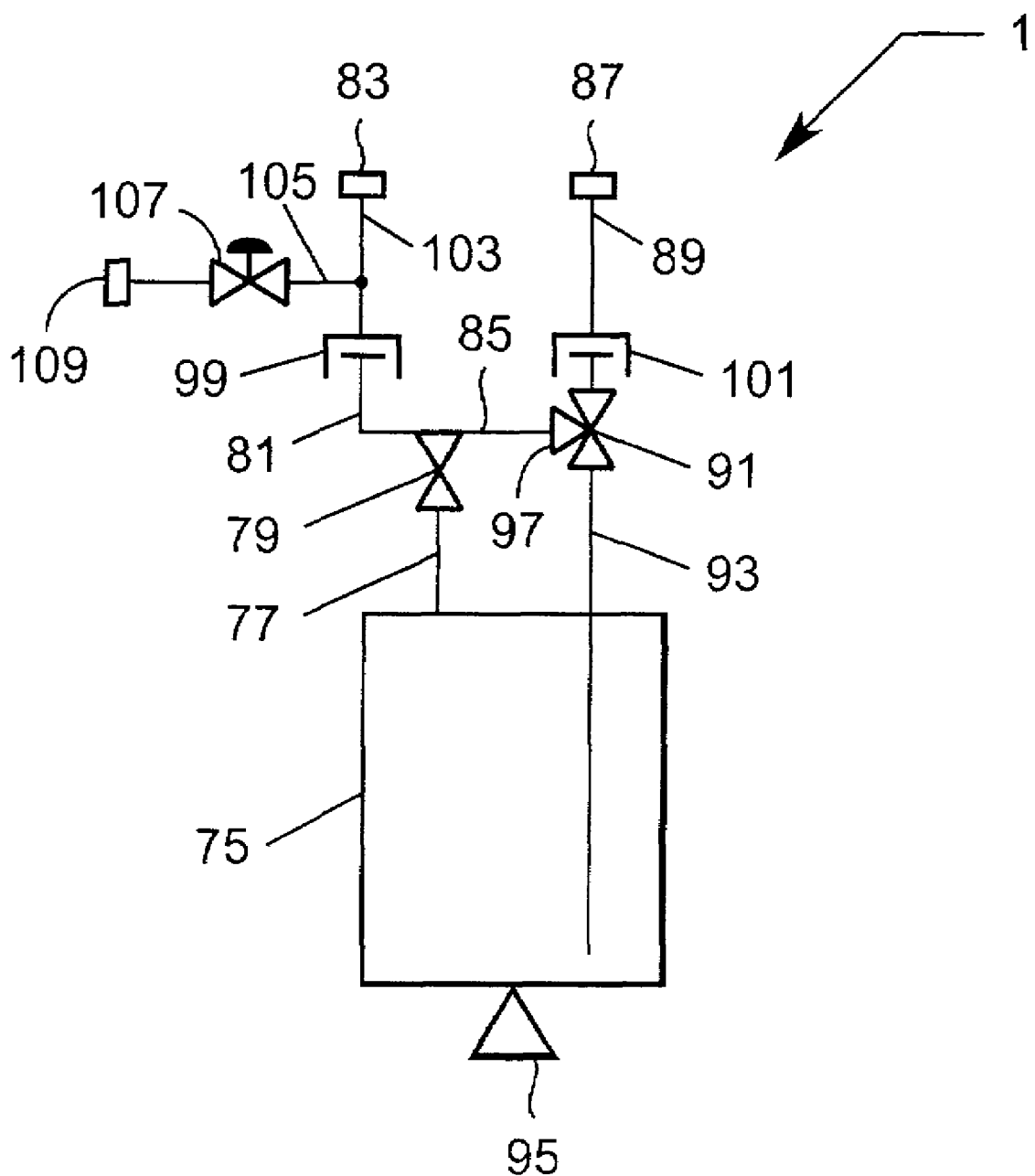
FIG. 8 is a schematic diagram of chemical container block.

In one aspect, the invention relates to a chemical container block for delivering an ultrapure chemical to a point of use or to an integral block. A preferred embodiment of the chemical container block is shown in FIG. 8. Container 75 is preferably a cylindrical shape, closed at its both top and bottom ends. A gas inlet conduit 77 with a valve 79, a tube 81, and a connection joint 83, is attached to the container for introducing pressurization gas into the container 75. The valve 79 is preferred to be a three-port valve with one port for control, such as those from Swagelok (Chicago, Ill.). The control port is preferred to be at the container side for controlling flow in and out of the container. A chemical outlet conduit 93 is attached to the container 75 and extended to inside the container down to near its bottom. This conduit 93 has a valve 91, a tube 89, and a connection joint 87 for connection with other chemical delivery blocks. The valve 91 could be either the same as the three-port valve 79, or a regular three-way valve with two-way control. A by-pass conduit 85 with a control valve 97 connects the gas inlet conduit 77 and the chemical outlet conduit 93 by connecting to one port of valve 79 and one port of the valve 91. If a three-way valve is used for the valve 91, one control way should be at the container side to connect with the portion of tube dipping into the container, and another control way should be at the by-pass conduit side to be connected with the by-pass conduit 85. In this case, the control valve 97 is replaced by the control way of three-way valve 91. The connection joints 83 and 87 could be male or female VCR fittings, or tube ends for welding to other blocks. A discharge conduit 105 with a control valve 107 and a connection joint 109 is jointly with a portion of the tube connected to other port of the three-port valve 79 for releasing pressure of the container 75 and discharging chemical waste from system purge and cleaning. The conduit 105 can be connected to the chemical outlet conduit 93 to the tube 89 for the same function. A level monitor 95 is used to monitor chemical level inside the container. The level monitor could be a weight scale that is normally removable attached to the bottom of the container 75. Other type of level sensors such as ultrasonic level sensors and optical level sensors could also be used. In the case of optical level sensors used, the sensors should be mounted at the side of the container with a transparent window. The container 75 could have the capacity of 1 liter to more than 200 liters and be made with the materials compatible with chemicals to be handled, including stainless steel, TEFLON, polyethylene, glass, and quartz. When necessary, the container is disconnected from other portion of the manifolds at the joints 99 and 101. The valves 79, 91, and 97 with the tubes next to the container should always attach to the container.

Figure 9:
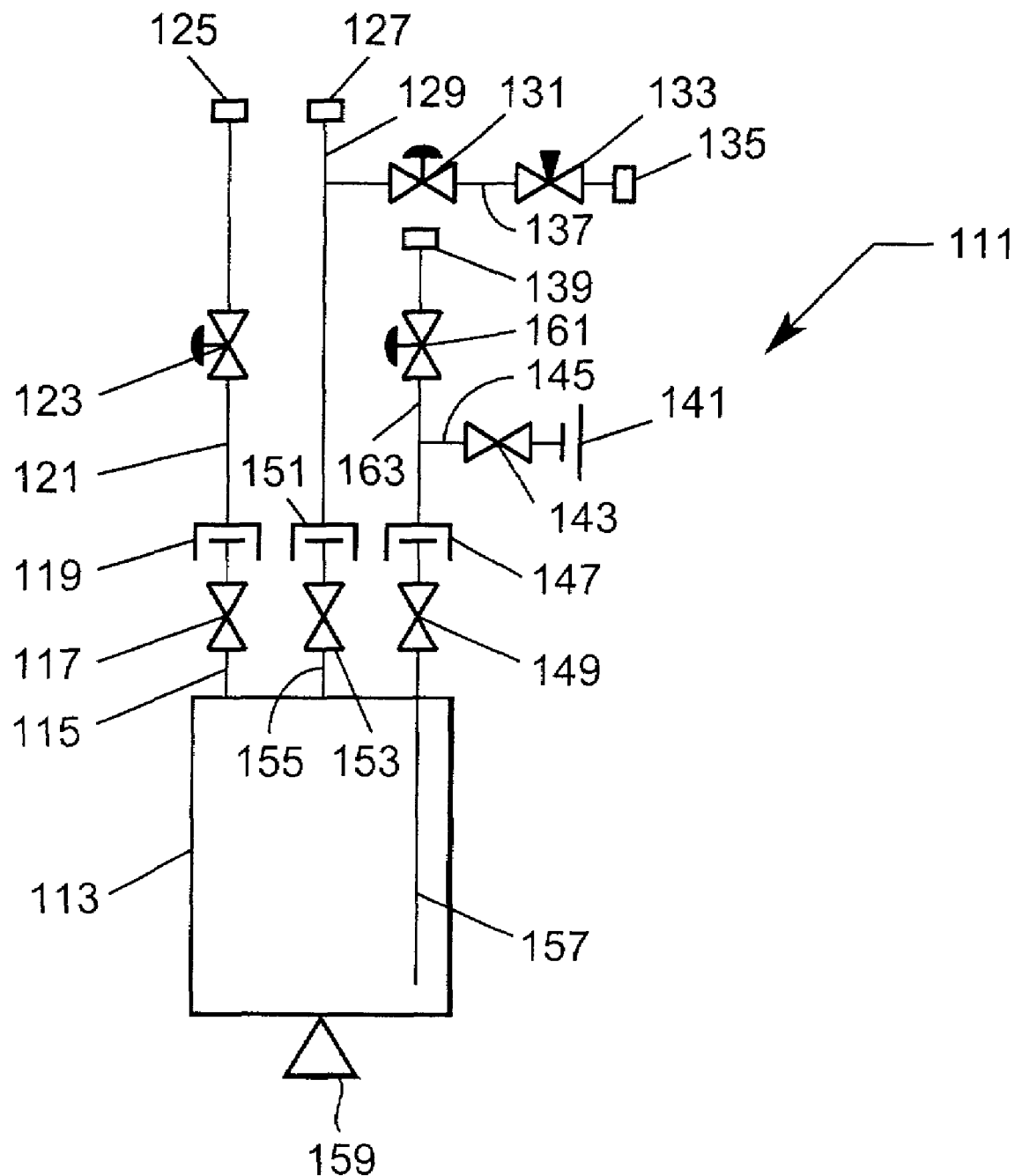
FIG. 9 is a schematic diagram of chemical recharge container block.

In another aspect, the invention relates to a recharge container block, for receiving chemicals from a chemical container block and delivering chemicals to a point of use or an integral block. The recharging container block may be used to provide continuous delivery of an ultrapure chemical. FIG. 9 is a preferred embodiment of recharge container block 111. A cylindrical shape container 113 has two ends sealed for receiving chemicals from the chemical container block 1 and delivering chemical to user tools. A chemical inlet conduit 115 with an isolation valve 117, a joint 119, a tube 121, a control valve 123, and a connection joint 125 is attached to the container 113 for refilling the container 113 with chemicals from the chemical container block 1. A gas conduit 155 with an isolation valve 153, a joint 151, a tube 129, and a connection joint 127 is attached to the container for pressurization gas. A conduit 137 with a control valve 131, a needle valve 133, and a connection joint 135 is connected to the tube 129 for exhausting pressurization gas from the container 113. The needle valve 133 is used for regulating the exhaust flow. The connection joint 135 can be connected to an facility exhaust line or other chemical delivery block. A conduit 157 with a dip tube into the container 113 extended near to the container bottom is attached to the container for chemical outlet. An isolation valve 149 is installed in the conduit 157 for isolation purpose and a control valve 161 is installed for controlling chemical flow. Optionally, a small conduit 145 with an isolation valve 143 and a capped sampling port is connected to the conduit 157 at the tube 163. When necessary, the isolation valve 143 can be turned on for taking samples from the port 141. There is a level monitor 159 attached to the container 113. This level monitor could be the same as the monitor 95 in FIG. 8. The container can be removed by disconnected at the joints 119, 151, and 147 when necessary: However, in the normal operation, the recharge container 113 with its manifold is fixed into a chemical delivery system unless a repair is needed.

Figure 10:
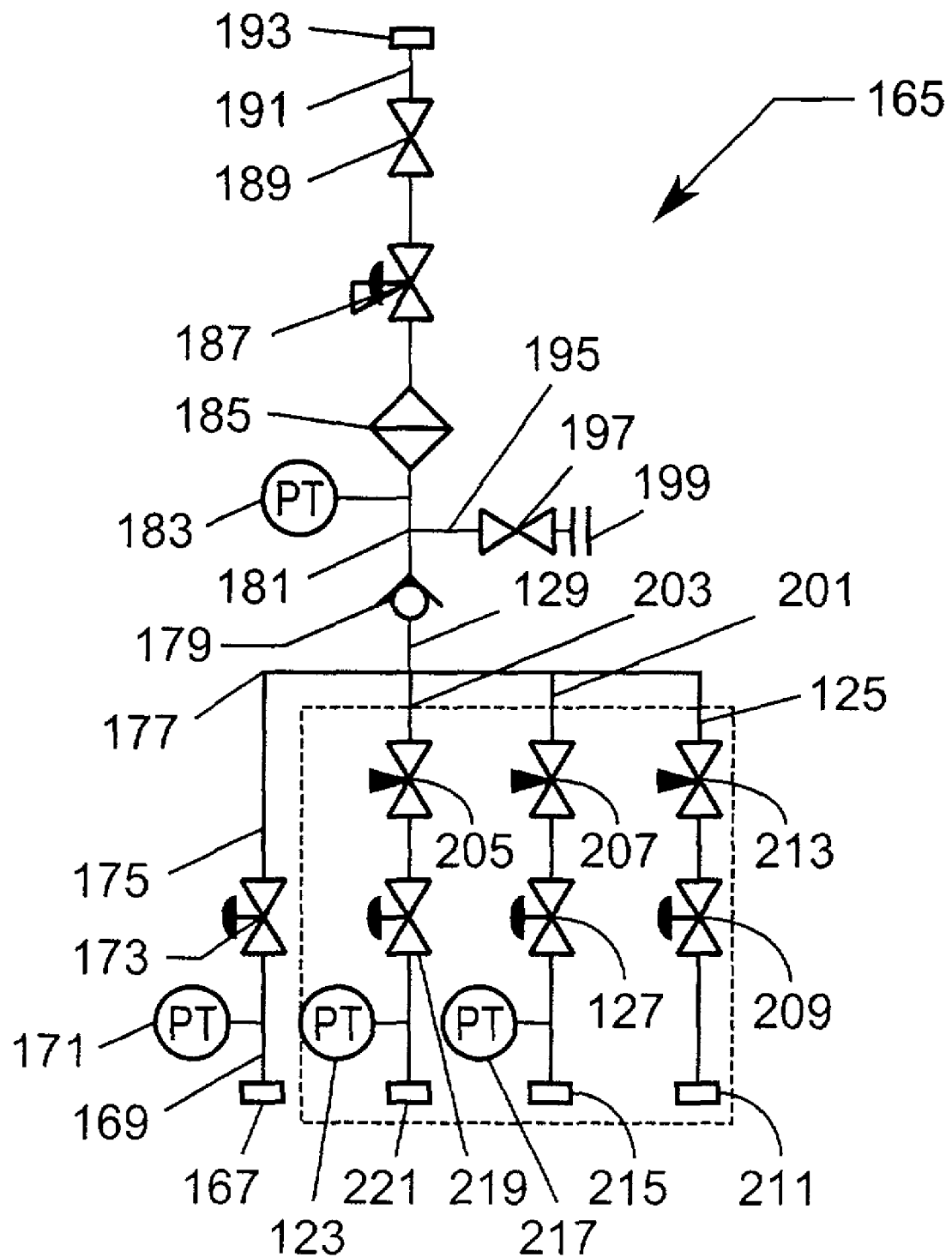
FIG. 10 is a schematic diagram of pressurization gas supplying block.

In another aspect, the invention relates to a pressurization gas block is used to provide pressurization gas to one or more integral block. FIG. 10 is a preferred embodiment of pressurization gas block 165. The pressurization gas could be an inert gas at pressure from 10 psi to 150 psi, normally about 100 psi. The inert gas could include helium, nitrogen, and argon. In most cases, helium is used because it is insoluble in a broad range of chemicals and is not a contaminant for the CVD deposition process. The inert gas source can be a bulk house gas supply system or a dedicated gas cabinet. The gas conduit 191 is connected to a gas source with the connection joint 193. This connection joint can be a regular VCR fitting or the like, or a tube open end to be welded on a gas supply line. An isolation valve 189 in the conduit is used to isolate the conduit from gas supply source. A regulator 187 is used to adjust the inert gas pressure to a preferred pressure. A filter 185 is preferred in the conduit for removing particles in the inert gas. The filter could be those metal and membrane type with pore size as small as 0.05 um, more preferred a sintered stainless steel metal filter with the pore size of 0.1 um. A pressure sensor 183 monitors the inert gas pressure after the regulator. The pressure sensor can be from those SPT or HPT series pressure transducers, or IPS series pressure switches by Millipore Corporation (Bedford, Mass.). A check valve 179 is used to prevent any fluid flowing back into the gas line. A pressure relieve valve 197 is attached to the conduit 191 for protecting the conduit from over pressured. If the pressure regulator failure or the regulator is mis-adjusted to a higher pressure setting than needed, the pressure relieve valve 197 will be open automatically to release the high pressure. The pressure relieve valve 197 could be replaced with an isolation valve, such as three-port manual valve, with a cap 199 at one end. This arrangement provides the convenience for operators to access the high pressure helium gas when it is necessary. There is at least one conduit 177 with a tube 175, control valve 173, a pressure transducer 171 and a connection joint 167 for flowing high-pressure inert gas to the chemical container block. More conduits 201 and 203 as in the dashed enclosure with the same components as the conduit 177 can be in parallel to the conduit 177 to supply high-pressure inert gas to the recharge container block 111 in FIG. 9 and solvent supply block 339 as in FIG. 14. Another conduit 125 with a control valve 209 can be connected jointly in parallel with the conduit 177 to the conduit 191. High pressure inert gas from this conduit 125 can be directly introduced to the chemical outlet line 89 in FIG. 8 for purge. Needle valves 205, 207, and 213 are used in each of conduits 201, 203, and 125. The needle valves 205, 207 and 213 are used to adjust the inert gas pressure for each block use. The connection joints 167, 221, 215, and 211 can be fittings such as VCR fittings and tube end openings to be welded with other joints.

Figure 11:
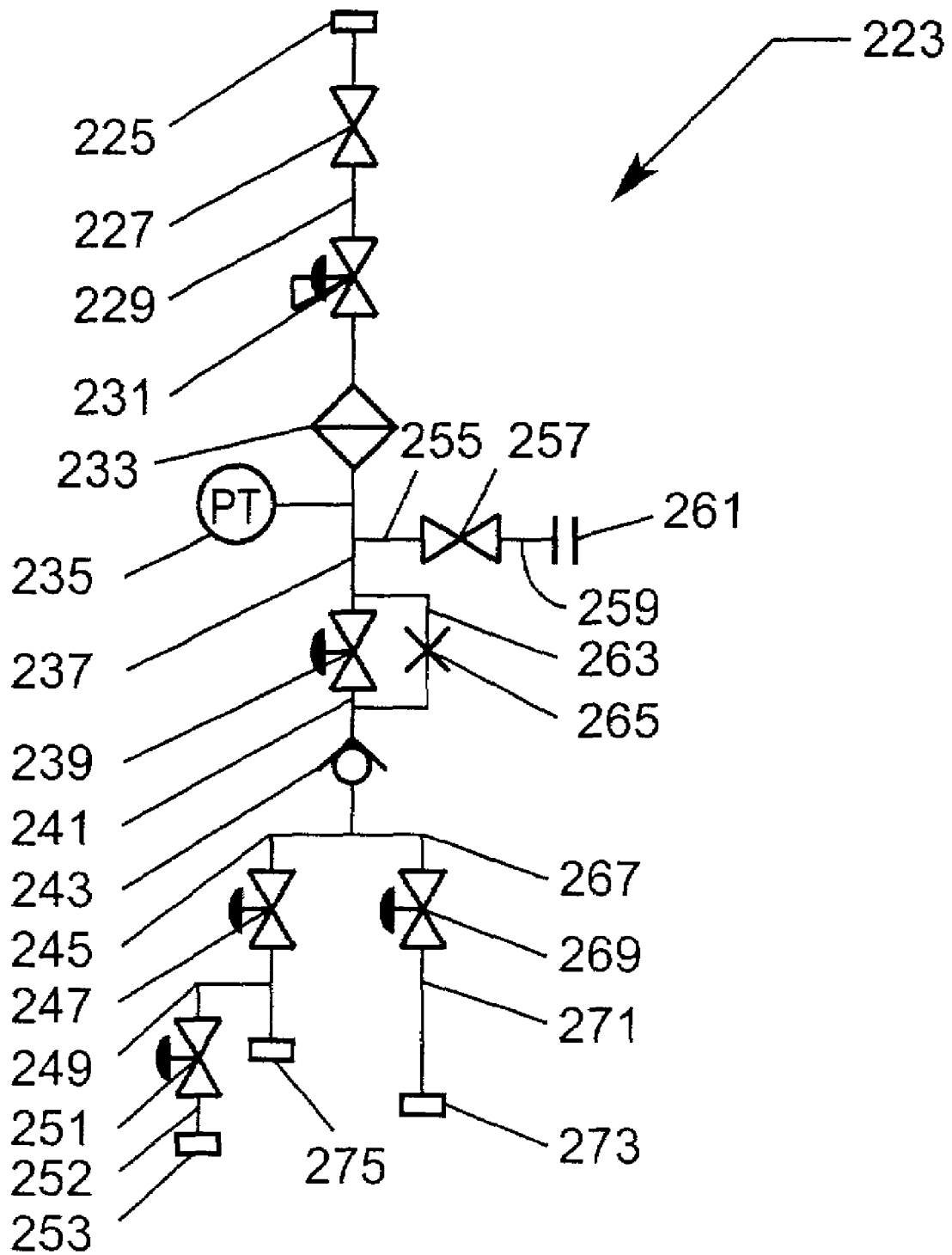
FIG. 11 is a schematic diagram of purge gas supplying block.

In another aspect, the invention relates to a purge gas block may be used in a chemical delivery system for providing a gas to purge the chemical lines and blank any line opens from ambient contamination. A preferred embodiment of purge gas block 223 is shown in FIG. 11. The purge gas source could be the same as the inert gas for pressurization gas. More preferred the purge gas is an inert gas with lower cost such as nitrogen. A conduit 237 has a connection joint 225, an isolation valve 227, a tube 229, a pressure regulator 231, a filter 233, a pressure sensor 235, a control valve 239, and a check valve 243. A pressure relieve valve 257 is attached to the conduit 237 with the tube 255 for relieving high pressure inside the conduit. As the pressure relieve valve 197 in FIG. 10, the pressure relieve valve 257 could be replaced with an isolation valve, such as a three-port manual valve, with a cap 261 at one end. Of course the whole conduit 255 with the valve 257 could be eliminated if there is no intention to flow the high pressure inert purge gas to any other location. A small branch 263 with a flow restriction orifice 265 attached to the conduit 237 in parallel to the valve 239 to allow a low flow of purge gas flow through even at the situation of control valve 239 closed. This low flow will allow the inert gas bleed from any opening in other chemical delivery blocks to blank the openings from ambient air intrusion. The control valve 239 and the small branch line 263 with the orifice 265 can be replaced with a leak valve as those manufactured by APTech (Napa, Calif.). The leak valve will function exactly as the combination of the valve 239 and the orifice 265. At least one conduit 245 with a control valve 247 and a connection joint 275 is connected to the conduit 237 for introducing purge gas to chemical container block 1. Another conduit 267 can be jointly connected with the conduit 245 to flow purge gas to a solvent supply block. A branch conduit 249 can be connected to the conduit 245 for bleeding purge gas though an opened joint 99 as in FIG. 8 while the chemical container 75 is disconnected.

Figure 12:
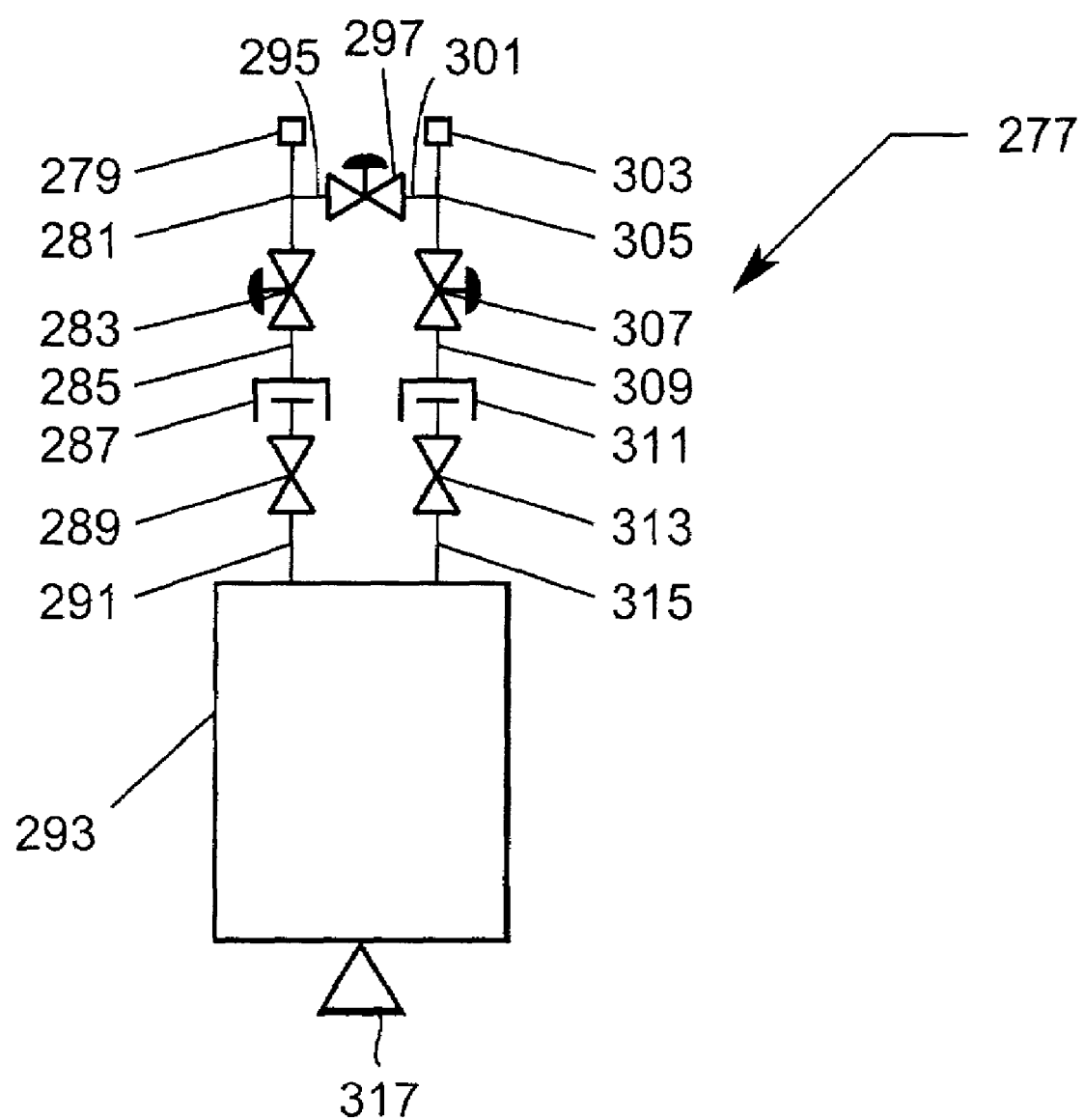
FIG. 12 is a schematic diagram of waste recovery container block.

In one aspect, the invention further relates to a waste recovery block to recover chemical waste from a purge and cleaning process of the delivery system. FIG. 12 is a preferred embodiment of waste recovery block 277. The waste recovery block could be used to recover the chemical and solvent waste from the system clean and purge process. A container 293 with the materials compatible with chemicals (such as stainless steel, TEFLON, polyethylene) receives chemical waste from other chemical delivery blocks such as chemical container block and chemical recharge block. A waste inlet conduit 291 connects to the line (such as the connection joint 109 in FIG. 8) in the block where purge and cleaning are conducted. The chemical waste flows through the tube 281, control valve 283, and isolation valve 289 into the container 293. Another conduit 315 is attached to the container 293 with one end and connected to an exhaust line or a vacuum block with the connection joint 303 at another end. The container can be exhausted by turning on the isolation valve 313 and the control valve 307. A by-pass line 295 with a control valve 297 connects to the waste inlet conduit 291 and the exhaust conduit 315 to the lines 281 and 305. When the chemical container block 1 needs to be exhausted or vacuumed, the control valve 297 in the by-pass conduit 295 could be turned on and the control valves 283 and 307 could be closed. A level monitor 317 is attached to the waste container 293 to monitor waste chemical level inside the container. The level monitor could be the same as those shown in FIGS. 8 and 9. Once the container is full, the isolation valves 289 and 313 are closed and the container can be disconnected at the joints 287 and 311 for replacement.

Figure 13:
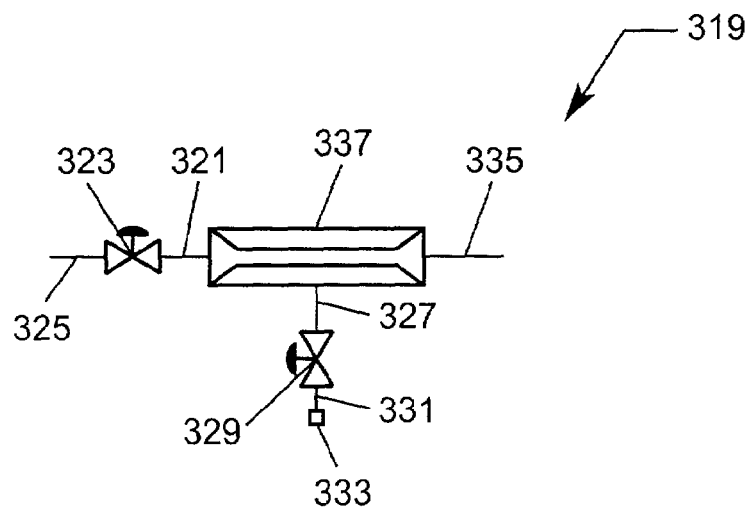
FIG. 13 is a schematic diagram of vacuum block.

In yet another aspect, the invention also relates to a vacuum block to provide a better purge and removing of gases in the delivery lines before introducing chemical into the delivery lines. Any suitable vacuum generator may be used. For example, the vacuum generator could be either a venturi or a vacuum pump. An example of a vacuum block 319 for producing vacuum is shown in FIG. 13. When a venturi is used, high pressure clean dry air (CDA) or nitrogen is needed for the operation. CDA or nitrogen is supplied by the correspondent source through the conduit 321 to the venturi. A control valve 323 in the conduit is used for the control of CDA or nitrogen gas. A line 335 connects to the vacuum generator 337 at one end and to an exhaust line at another end. The conduit 327 is the vacuum line for the communication of vacuum generator and the blocks where vacuum is needed. A connection joint 333 is used to connect the vacuum conduit to other chemical delivery blocks such as the waste recovery block at the connection joint 303 in FIG. 12. The connection joint 333 could be a VCR fitting, or a like, or a end opening of a piece of tube for welding connection.

Figure 14:
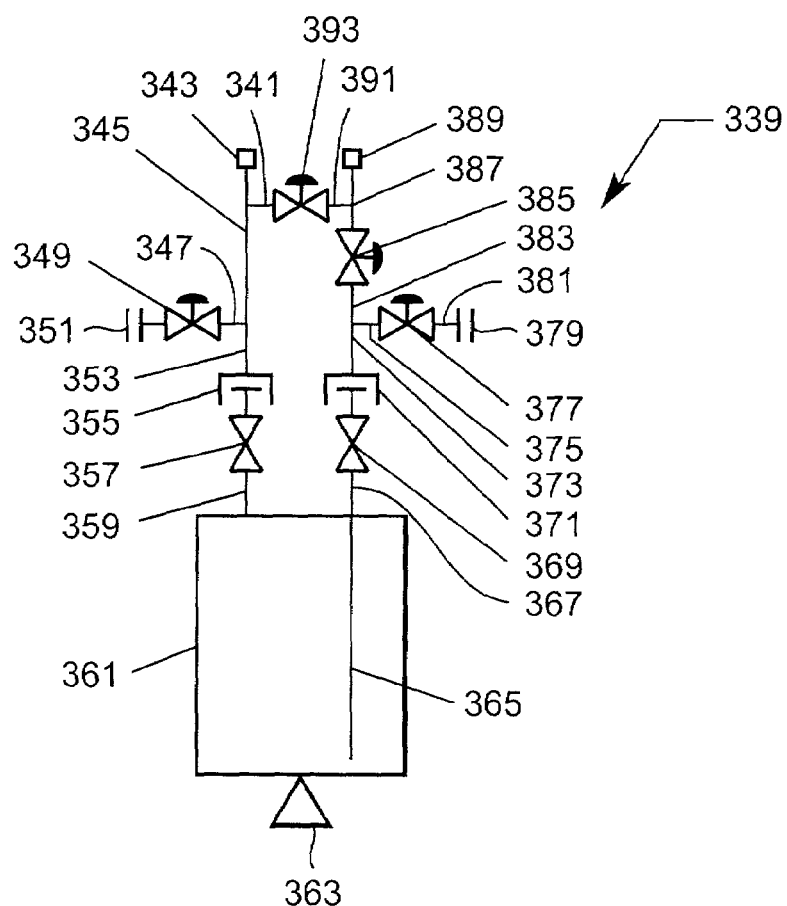
FIG. 14 is a schematic diagram of solvent supplying block.

In yet another aspect, the invention relates to a solvent supply block to provide solvent to purge low vapor pressure chemicals during chemical canister change process. A preferred embodiment of the solvent supply block is shown in FIG. 14. A solvent container 361 may have a similar shape as those for chemicals in the chemical container block 1 and recharge block 111 in FIG. 9. The container may have the capacity of 100 ml to 200 liters. A preferred solvent container may have the capacity of 1 liter to 10 liters. The solvent is normally supplied by pressurization with inert gas to the blocks such as chemical container block where solvent flush for system purge is necessary. A pressurization gas inlet conduit 359 is connected with one end to the solvent container and to an inert pressurization gas block with the connection joint 343 at another end. A line 347 with a control valve 349 is connected to the conduit 359 to the tube 353 for exhaust. Another end with the connection joint 351 can be connected to an exhaust line. A solvent outlet conduit 367 for solvent supply has a dip tube 365 extended into the container to the position near to the container bottom, a line 373, a line 375, and a control valve 377. The solvent outlet conduit 367 could be connected to the chemical container block with the connection joint 379. A solvent delivery conduit can be jointly connected to the connection joint 379 to deliver solvent to any location such as user tools when necessary. Line 383 is for purge gas from a purge gas block as in FIG. 11. A by-pass line 341 with a control valve 393 connects to the purge line 383 at the tube 387 with one end and to the pressure gas inlet conduit 359 at the tube 345 with another end. In the process of changing the solvent container, purge gas is introduced in the conduit 367 to purge the line 375 and 373. Purge gas is also used to blank the line opening by opening the control valves 393 and 385 when the joints 371 and 355 are disconnected. A level monitor 363 as those for chemical containers is used to monitor the solvent level inside the container. Once the container is empty, it can be replaced by disconnecting the joints 355 and 371. The solvent for purging and cleaning chemical residual inside the chemical delivery lines can be selected based on the physical and chemical properties of precursor chemicals and solvents. For example, tantalum pentaethoxide (Ta(OEt)$_5$) is easily dissolved in ethanol, and the ethanol is also easy to be removed and cleaned from the lines. Ethanol can then be selected for purging and cleaning the delivery lines for tantalum pentaethoxide. Other solvents like hexane, octane, and those mentioned for preparing chemical precursor solutions could be used for various precursor chemical residual cleaning.

Figure 15:
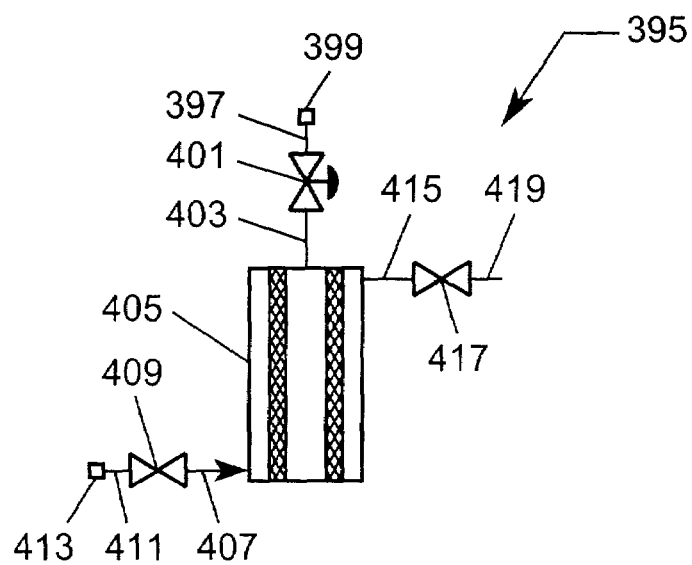
FIG. 15 is a schematic diagram of degassing block.

In yet another aspect, the invention relates to a degas block and a filtration block, which are used for removing unnecessary dissolved gas and particulate impurities when needed. A preferred embodiment of the degas block 395 is shown in FIG. 15. The degas block is used for removing dissolved gas in the chemicals. Dissolved gas in chemicals is usually removed with a membrane cartridge. Chemicals flow in one side of the membrane cartridge and dissolved gas diffuses through the membrane media to another side by either concentration gradient or pressure difference, or both. A membrane cartridge 405 with a housing as in FIG. 15 could be used for degassing. Chemical is introduced into the cartridge housing through a conduit 407 with an isolation valve 409 and flow out to user tool from a chemical outlet conduit 415. Another conduit 403 is connected to the membrane cartridge at another side for vacuum or exhaust. A control valve 401 is used for vacuum or exhaust control purpose. When the membrane cartridge needs to be replaced the isolation valves 409 and 417 will be closed manually, and the control valve 403 will also be closed. The chemical inlet conduit 407 is connected with the connection joint 413 to a chemical delivery block such as the chemical container block, and chemical recharge block. A connection joint 419 connects to a chemical line down stream to user tool. The connection joints again could be the fittings such as VCR fittings or a tube end opening for welding connection. A chemical purge line (not shown) may be needed for purging chemicals from the cartridge housing before changing and after installing a cartridge.

Figure 16:
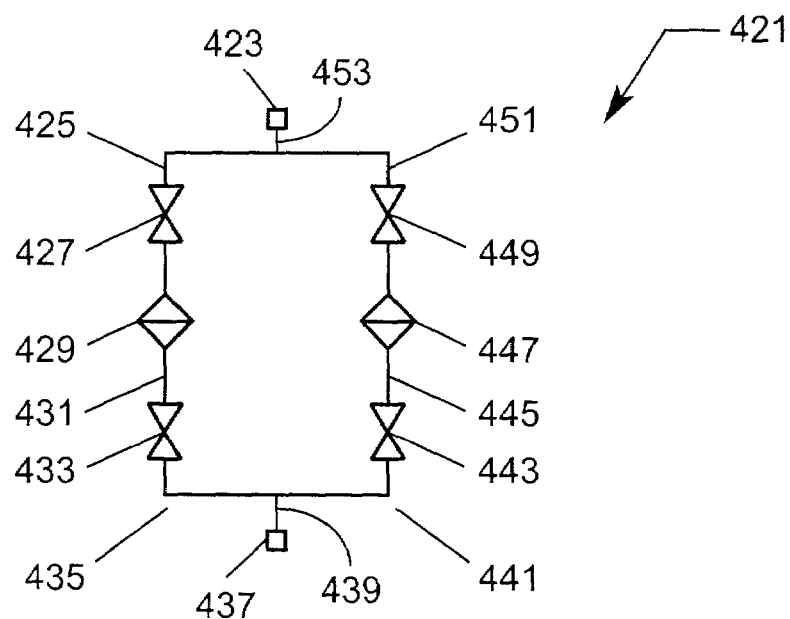
FIG. 16 is a schematic diagram of filtration block.

FIG. 16 is a filtration block 421 that can be connected into the chemical line for removing particles in chemicals. Two filters are preferred in parallel with one in use and another in spare. As in FIG. 16, a conduit 435 with filter 429 and two isolation valves 433 and 427 installed before and after the filter is used for chemical filtration. In parallel, another conduit 441 with filter 447, and two isolation valves 443 and 449 jointly connected to the chemical lines 439 at upstream and the chemical line 453 at downstream. As an alternative, the isolation valves 433 and 443 can be combined as a three-way valve, and the isolation valves 427 and 449 can be a three-way valves as well. When a filter is to be changed, the isolation valves in the filtration conduit before and after the filter are closed and at the same time another filter is used for filtration by turning on the corresponding isolation valves. Gas and solvent purging for cleaning chemicals in the filtration conduit is necessary for many chemicals when a filter needs to be replaced. Purge gas, solvent, and waste lines (not shown) may be needed.

The integral blocks of the invention may be used to form chemical delivery systems. Various optional blocks could be added into a basic system for different needs. Each block stands along and functions independently in a delivery system of various combinations of blocks. It is also useful for many applications to include a control block, with a computer or a PLC system to receive signals from the components of each block and sends signal to the components for automatic control.

In one preferred embodiment as shown in FIG. 1, a basic chemical delivery system consists of chemical container block 1, a recharge container block 7, a pressurization gas block 15, and a control block 23. The chemical container block 1 with chemical source and related manifold supplies chemicals to a recharge container block 7 through a connection 3. Chemicals are delivered from the recharge container block 7 through a connection line 9 to manufacturing tools. Of course, chemical can also be fed from the chemical container block 1 to manufacturing tools through a connection line even though it is not shown. A pressurization gas block 15 provides high-pressure inert gas to chemical container block 1 and recharge container block 7 to drive chemicals out of containers for delivery. The block 15 connects with blocks 1 and 7 by the connections 17 and 19 respectively. The chemical containers in blocks 1 and 7 can be depressurized by exhausting the pressurization gas from the containers through the connections 5 and 11 to exhaust line 13. A connection line 21 is for high-pressure release in case of the block 15 over-pressurized. All of the connections can be either a regular fitting, such as a VCR fitting, or a small piece of tube with fittings at both ends, or a piece of tube with both open ends for welding connection. An automatic control block 23 communicates with the blocks 1, 7, and 15 to receive and send signals for automatic operation of the chemical delivery system by the connection lines 25, 27, and 29.

Figure 2:
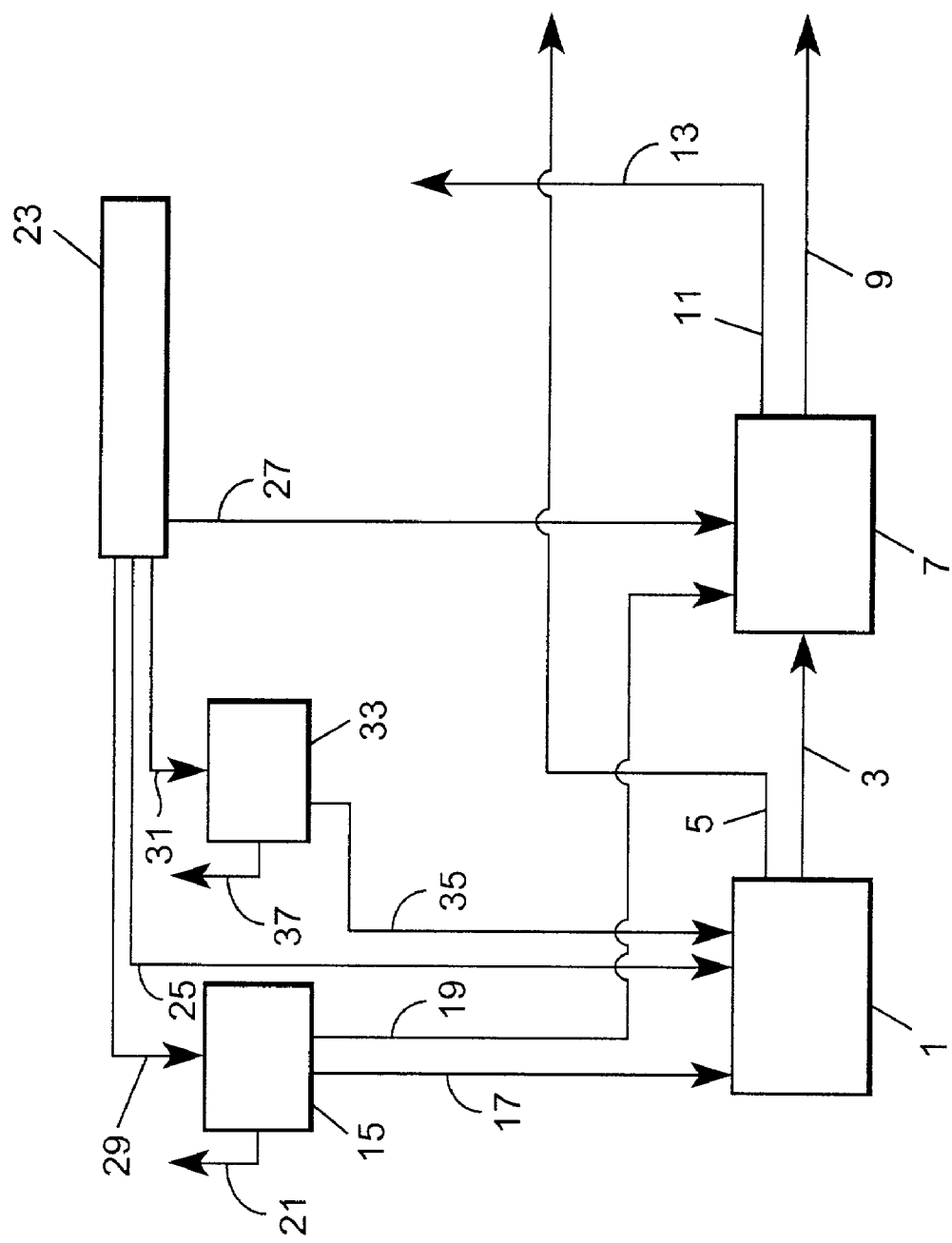
FIG. 2 is a schematic diagram of a basic chemical delivery system with a purge gas block.
Figure 3:
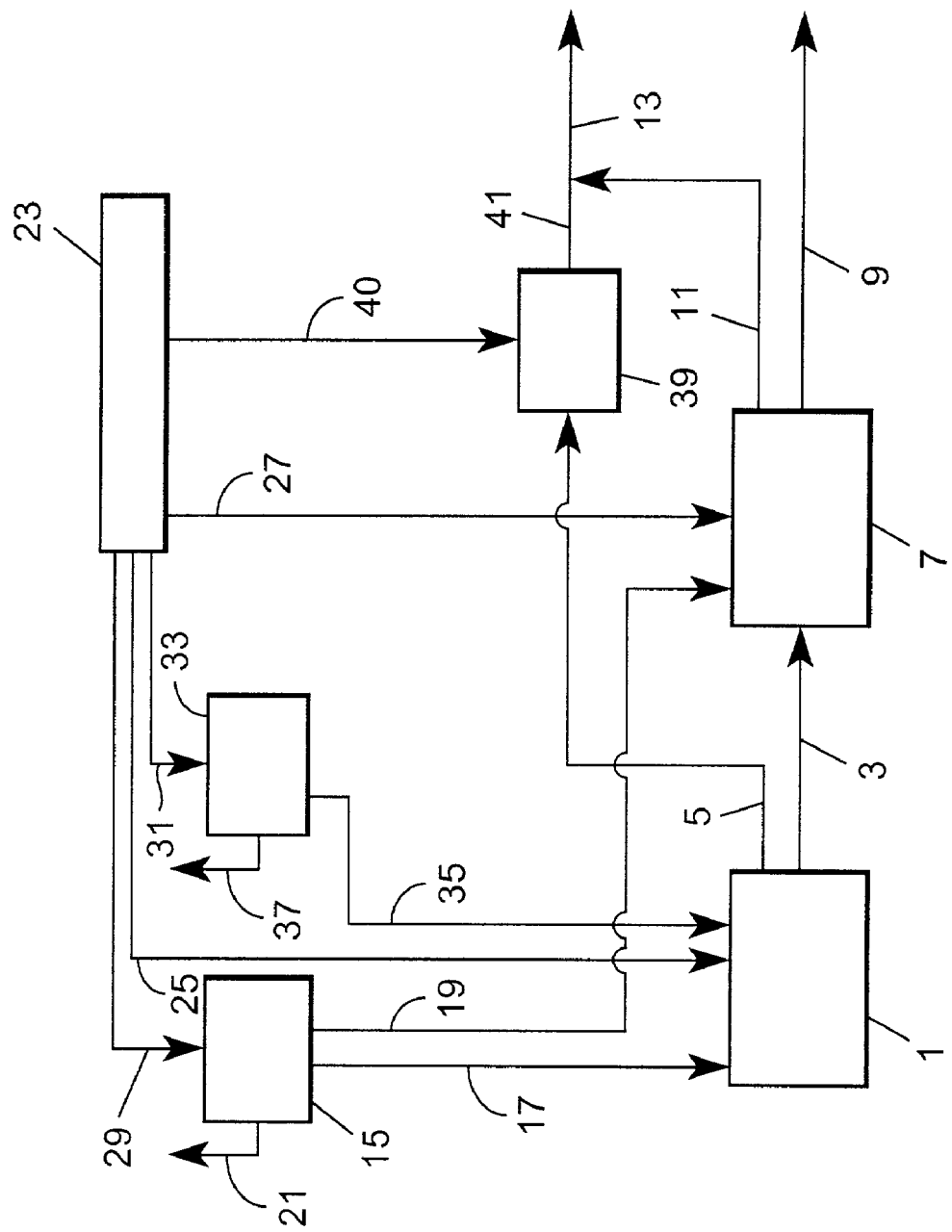
FIG. 3 is a schematic diagram of a chemical delivery system with purge gas and waste recovery blocks.

FIG. 2 shows another basic chemical delivery system with purge gas block 33 to provide inert purge gas to the chemical container block 1. The purge gas could be an inert gas (such as helium, nitrogen, argon) that is the same as, or different from, the pressurization gas. The block 33 provides purge gas to the block 1 through the connection 35. There is a high-pressure exhaust connection 37 to release pressure when it is necessary. The automatic control block 23 communicates with the purge gas block 33 through a connection 31 for automatic control. The purge gas will be supplied to the chemical block 1 during chemical container changing process for purging residual chemicals and blanking any line opening from ambient air intrusion.

Chemical waste may be produced when a chemical container or any line needs to be purged and cleaned. Chemical waste can be sent to a facility waste treatment center through a waste line. In many cases, chemical precursor waste needs to be specially treated. Therefore, the chemicals have to be collected separately for the treatment or final disposal. As in FIG. 3, a chemical waste block 39 is used to collect chemical waste from the delivery system. The chemical waste block 39 is connected to the chemical container block 1 by the connection 5 and to the automatic control block 23 by the connection 40. The block 39 is also connected to an exhaust line 13 by the connection 41. Exhaust from the block 1 can either go through the waste block by the same connection 5 for chemical waste or by an additional connection (not shown) to the exhaust line 13.

Figure 4:
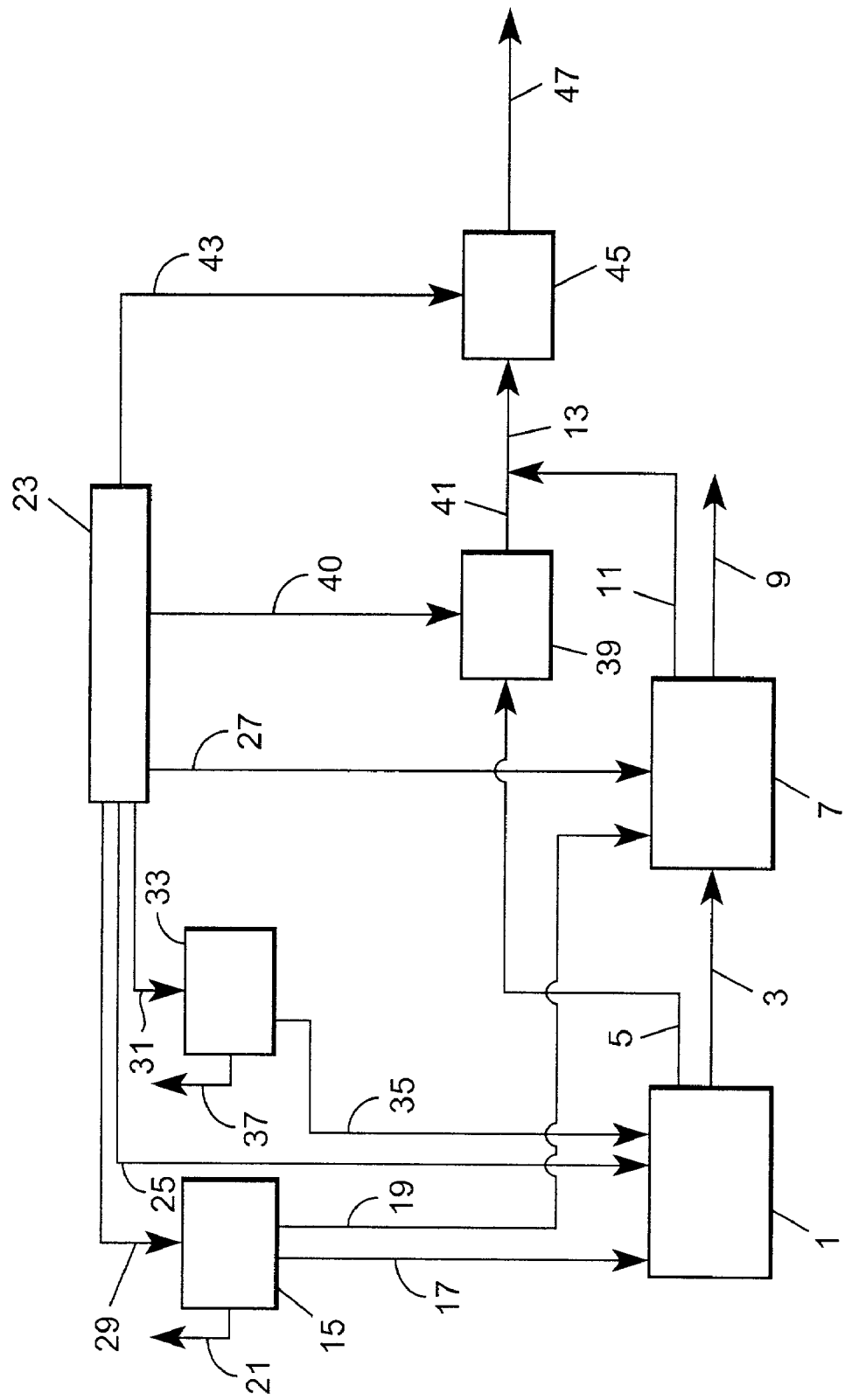
FIG. 4 is a schematic diagram of a chemical delivery system with purge gas, waste recovery, and vacuum blocks.

FIG. 4 shows another preferred embodiment of a chemical delivery system by using a vacuum block 45. In the system purge process, vacuum is necessary to enhance the purge and remove gaseous residuals, such as purge gas and pressurization gas remaining inside chemical delivery lines before introducing chemical into the delivery lines. As in FIG. 4, the vacuum block 45 can be connected to a waste recovery block 39 and a recharge container block 7 by an exhaust line 13, the connection 11 and the connection 41. Exhaust from the vacuum block can be connected to an exhaust line by the connection 47. The vacuum block 45 also communicates with the automatic control block 23 by the connection 43. In an alternative system, the waste recovery block 39 can be eliminated from the delivery system. Therefore, the vacuum block 45 will be connected directly to the chemical container block 1 and chemical recharge container block 7. Of course, the chemical recharge container can be connected directly to an exhaust line without being connected to the vacuum block.

Figure 5:
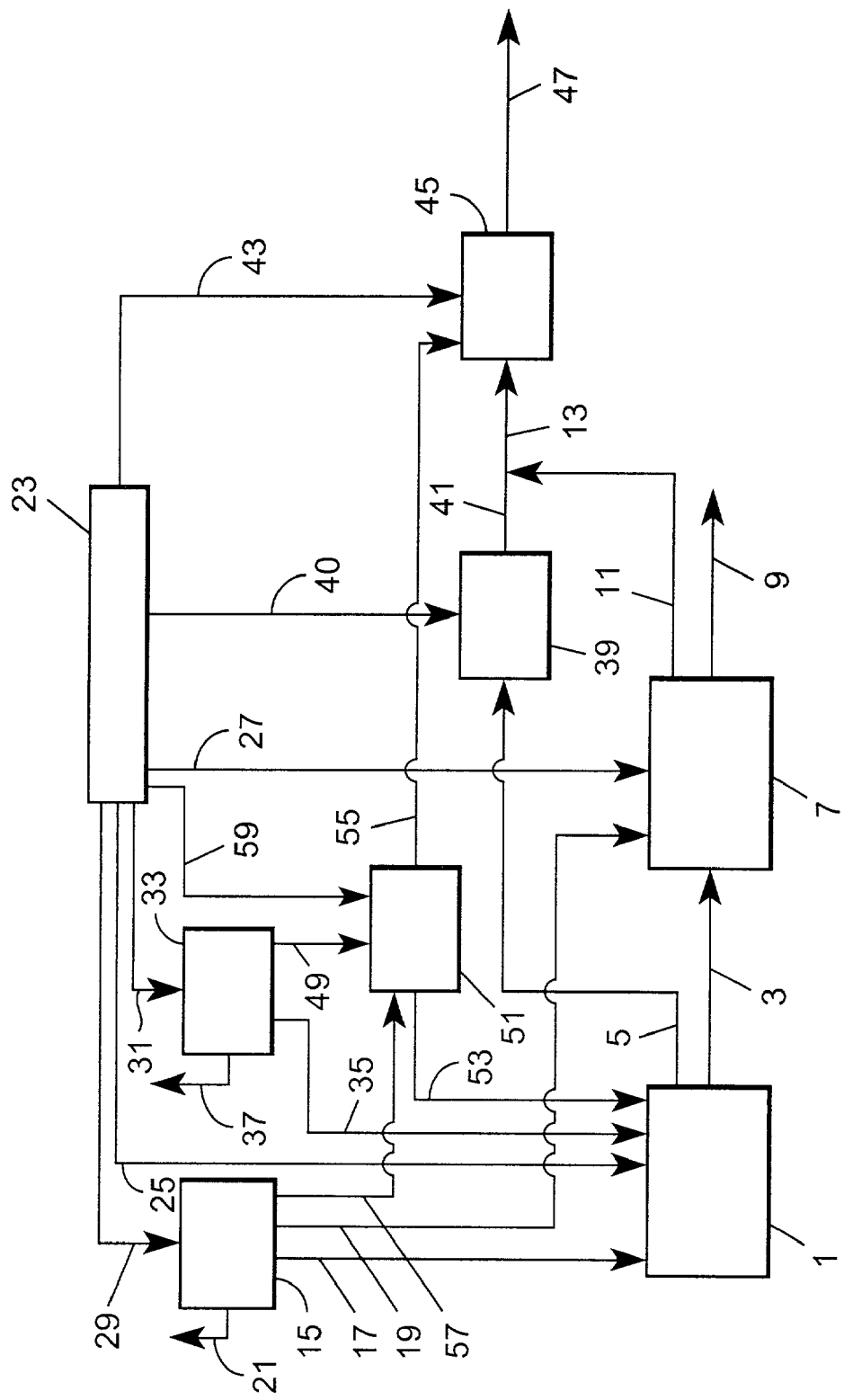
FIG. 5 is a schematic diagram of a chemical delivery system with purge gas, waste recovery, vacuum, and solvent supply blocks.

FIG. 5 shows a preferred embodiment of chemical delivery system with solvent supply block 51. Solvent is needed for flushing the delivery manifold of chemical container block 1 during the process of changing chemical source container. For example, ethanol is used to flush and clean the residual of tantalum pentaethoxide within the delivery manifold when the chemical source container needs to be changed. The solvent is usually contained in a similar container as that for chemical precursors and supplied to the chemical container block by pressurization. The solvent supply block 51 connected to the pressurization gas block 15 by the connection 57. Solvent in a solvent container is pressurized by the pressurization gas from the block 15 for supplying solvent through the connection 53. When the empty container needs to be replaced, the remaining solvent in the solvent supplying line must be cleaned and purged. Purge gas is provided from the purge gas block 33 to the solvent supply block 51 through the connection 49 for cleaning and purging. The solvent supply block 51 communicates with the automatic control block 23 through the connection 59 for control. A connection 55 is used to connect the block 51 with the vacuum block 45 or an exhaust line to vacuum and release the pressure in the solvent supply block 51. Although a waste recovery block and a vacuum block are preferred when the solvent supply block is used in a chemical delivery system, the solvent supply block can be added into the basic delivery system as shown in FIG. 1. The functions of waste recovery block and vacuum block may not be necessary in some cases or could be replaced by a similar capability of facility site.

Figure 6:
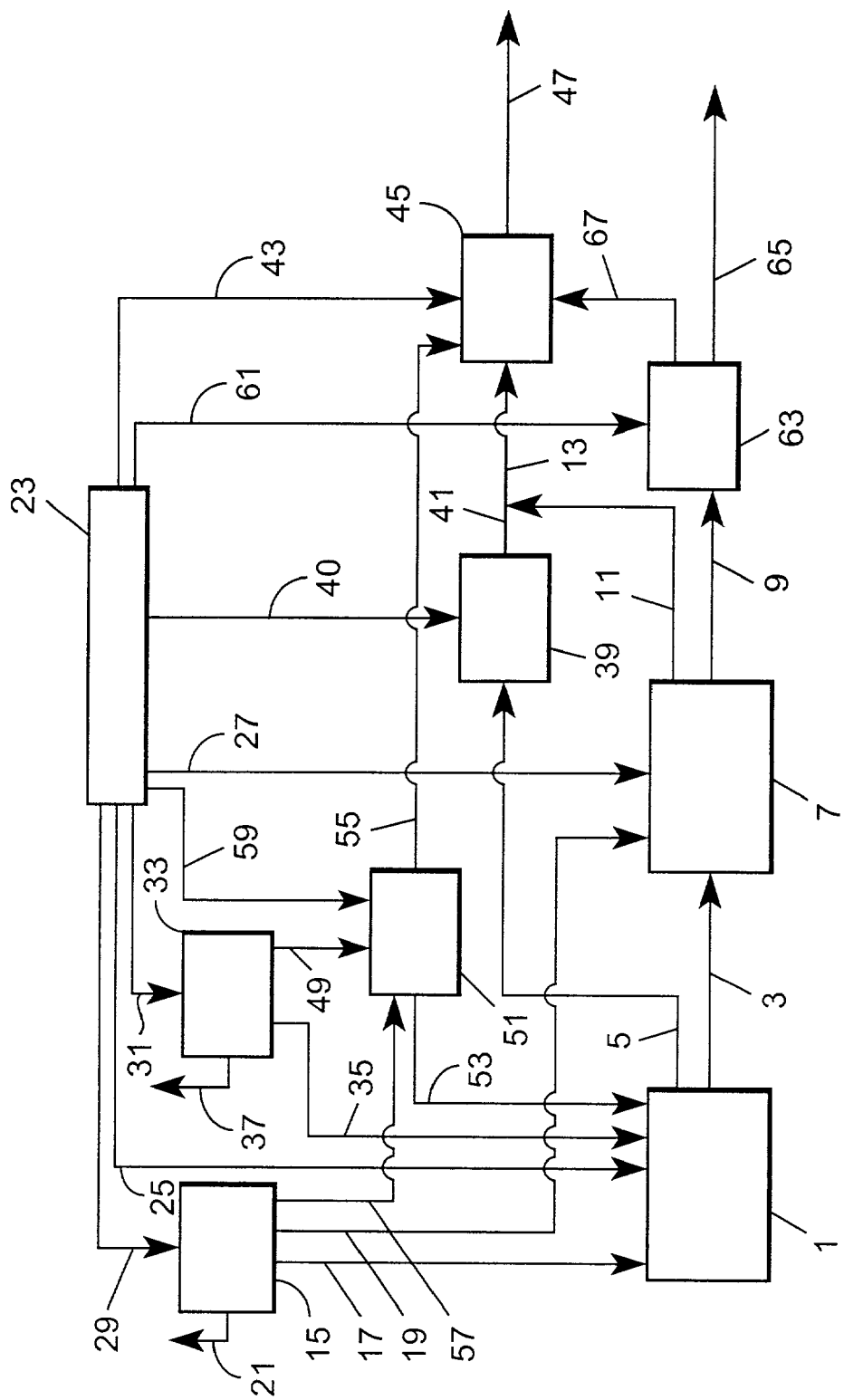
FIG. 6 is a schematic diagram of a chemical delivery system with purge gas, waste recovery, vacuum, solvent supply, and degassing blocks.

As another option, a degassing block 63 can be used to remove dissolved gases in the delivered chemicals as shown in FIG. 6. Gas such as helium and nitrogen may dissolve in chemical precursors during the chemical manufacturing and delivery processes. In most of the chemical delivery cases, a mass flow controller is installed to monitor and control chemical flow. Any dissolved gas in the delivery chemicals may become gas bubble when local pressure changes. There is a high possibility that the gas bubble will attach on the wetted surface of mass flow controller resulting in the malfunction of mass flow controller. The dissolved gas may further affect the vaporization of chemical precursors in the chemical vapor deposition tool. Chemical vapor concentration will not be constantly maintained and the vapor could also be contaminated by the dissolved gas. Chemical from the chemical recharge block 7 or chemical container block 1 goes to the degassing block 63 through the connection 9 for removing dissolved gases. After degassing, the chemical is then flow out of the block 63 to user tool from the connection 65. When a membrane type of degassing unit is used, vacuum or stripping gas is needed. As in FIG. 6, the block 63 can be connected with the vacuum block 45 by the connection 67.

Figure 7:
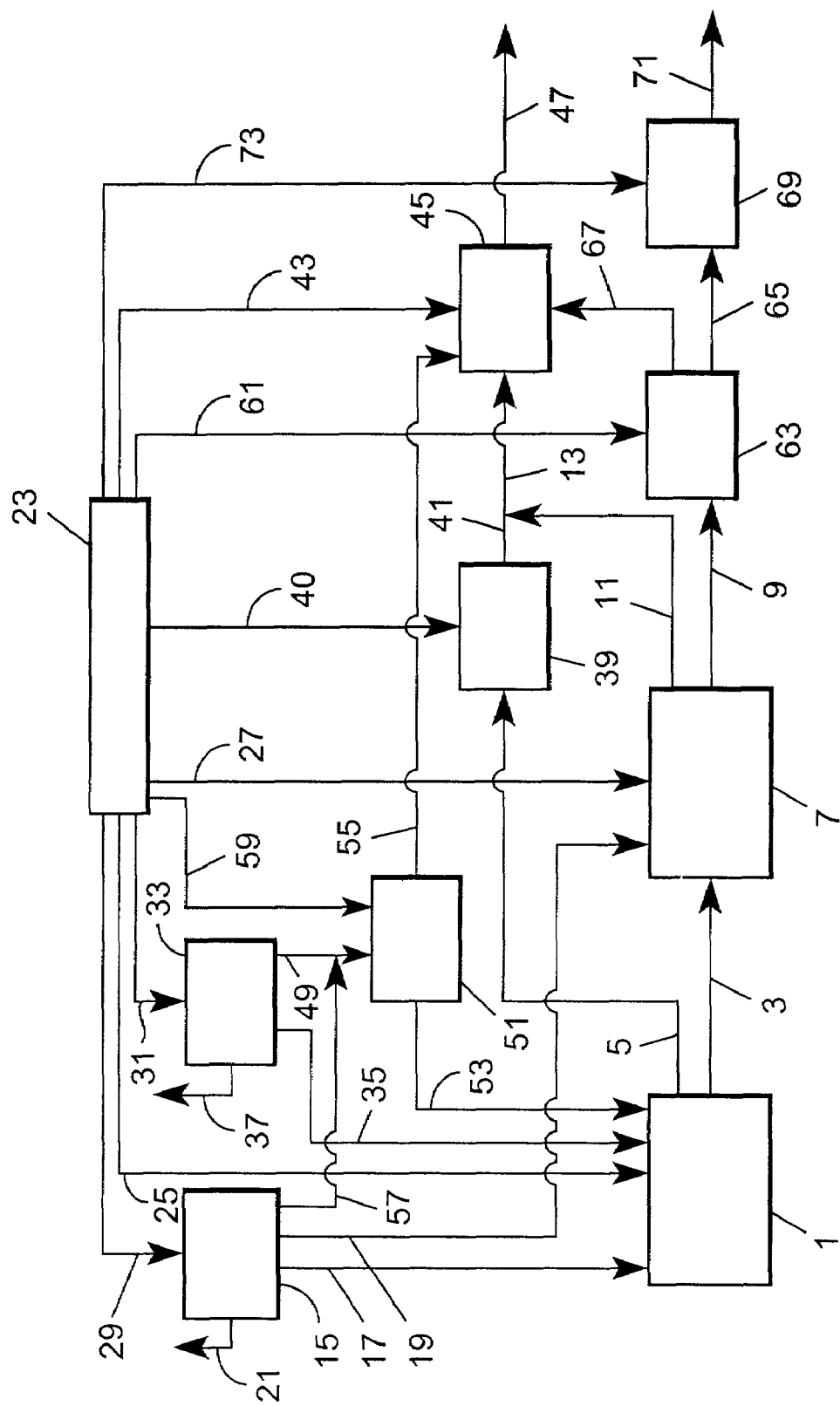
FIG. 7 is a schematic diagram of a chemical delivery system with purge gas, waste recovery, vacuum, solvent supply, degassing, and filtration blocks.

FIG. 7 shows another preferred embodiment of chemical delivery system with an additional option of filtration block 69. The filtration block is used to remove particulate contaminates in chemical precursors. Chemical from either the chemical container block 1, or chemical recharge block 7, or degassing block 63 could flow into the filtration block 69. As in FIG. 7, chemical is introduced into the filtration block through the connection 65 from the degassing block 63. The block 69 can also communicate with the automatic control block 23 through the connection 73. Of course, the filtration block 69 can be used in any different combination of chemical delivery blocks. For example, the filtration block can be added into the basic system as shown in FIG. 1 for chemical filtration purpose.

Each chemical delivery block is preferred to have all of the components for independent function. Once the blocks are connected for chemical delivery, the connection is fulfilled by a simple way, such as by regular fittings and welding. There is no any component, such as valves, of each block to be removed or added. FIGS. 8 to 16 are the preferred embodiments of each function block as those mentioned in FIGS. 1 to 7.

Figure 17:
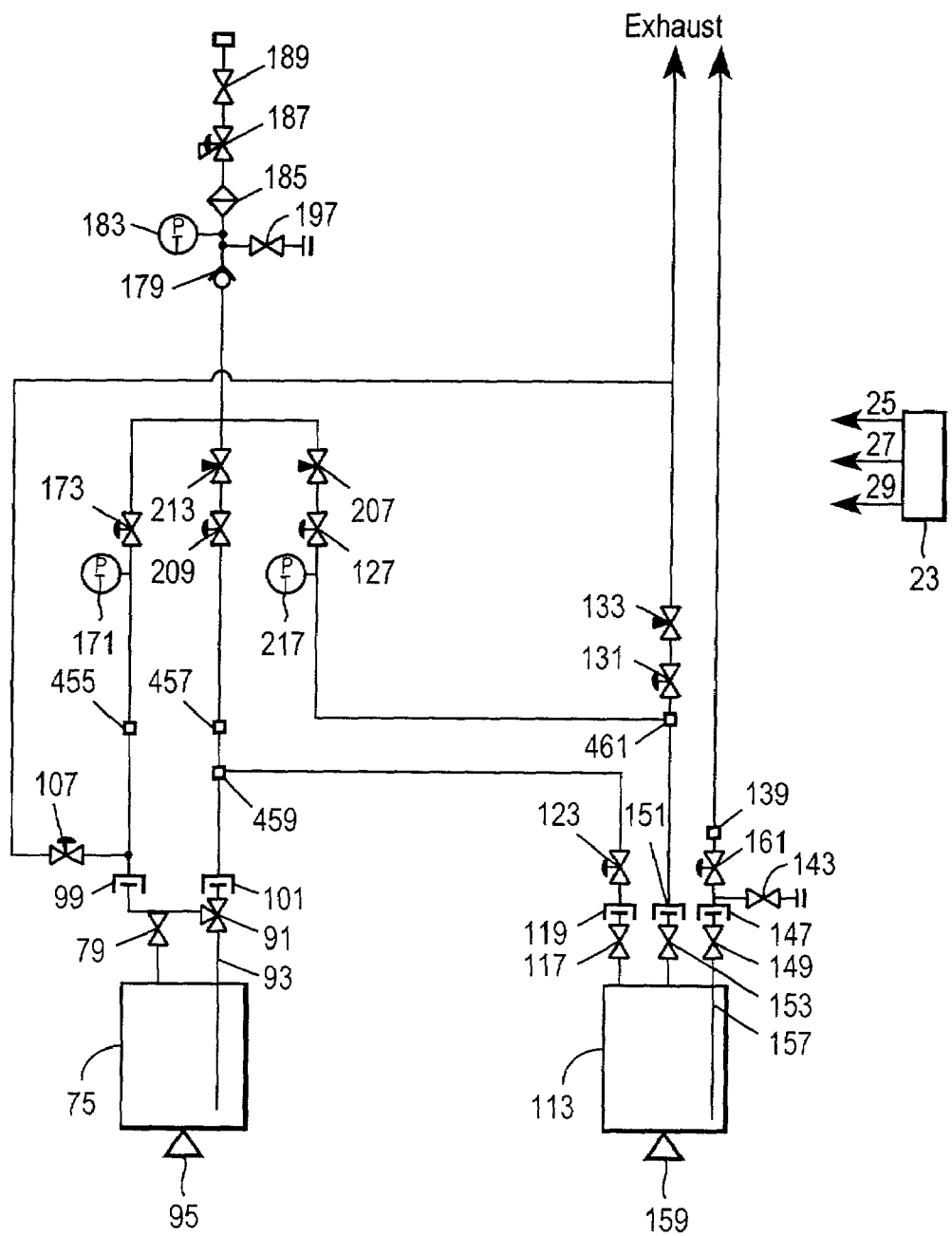
FIG. 17 is a schematic diagram of interconnections of different blocks in a basic chemical delivery system.

With different chemical delivery blocks as described, a chemical precursor delivery system can be built for various delivery requirements by simply connecting each block. FIG. 17 is a preferred basic delivery system with the chemical container block 1 as in FIG. 8, pressurization gas block 165 as in FIG. 10, chemical recharge block 111 as in FIG. 9, and automatic control block 23. The chemical container block is connected with the pressurization gas block at the points 455 and 457. The connection point may not be necessarily a physical joint that can be disconnected by one means. Instead, it merely means that two blocks are connected together to form an integral and uniform conduit for a specific function in delivering chemicals. Hence, a pressurization gas inlet conduit for the chemical container 75 with an isolation valve 79, pressure sensor 171, and a control valve 173 is formed. Similarly, purge gas conduit with a needle valve 213, a control valve 209, and another control valve 91 is also formed for purging the chemical delivery lines with the inert gas from the pressurization gas source. The chemical recharge block is connected with the pressurization gas block at a connection point 461 to form a gas inlet conduit with an isolation valve 153, a pressure sensor 217, a control valve 127, and a needle valve 207. A chemical recharge conduit consists of an isolation valve 117, a control valve 123, and an isolation valve 91. Chemical is delivered to user tools by the recharge container 113 through a chemical conduit with a control valve 161. A chemical sample can be taken from the delivery line by turning on the hand valve 143. Of course, a chemical can be delivered to user tools directly from the chemical container block by adding a by-pass line (not shown) between the connection points 459 and 139. Once the chemical level goes down to a preset low level, the control block will receive the signal from the level monitor 159 and send a signal to open the control valve 123 for recharging chemical into the recharge container. Once the chemical level reaches a high level, the control valve 123 will be closed in a similar way. During the recharging process, chemicals are continuously delivered from the recharge container 113 to user tools. The pressure of pressurization gas inside the recharge container will be balanced by automatically turning on or off the control valve 131. A needle valve or a pressure control valve 133 is used to restrict the release gas flow to avoid a sudden change of gas pressure. When the chemical container 75 is empty, the automatic control block will send an alarm to operator for container exchange. The control valve 107 will be automatically turned on to release the pressure inside the container. Remaining chemicals in the line before the control valve 123 will be pushed back to the chemical container by opening the inert gas control valve 209. After the isolation valves 79 and 91 are manually closed by operator, the container can then be disconnected at the joints 99 and 101 for exchange. Before disconnection, the control valves 173 and 209 could be turned on to allow inert gas flow down to the isolation valves 79 and 91. Upon the disconnection, inert gas can bleed out from the joints 99 and 101 to blank the openings from ambient contaminant intrusion.

Figure 18:
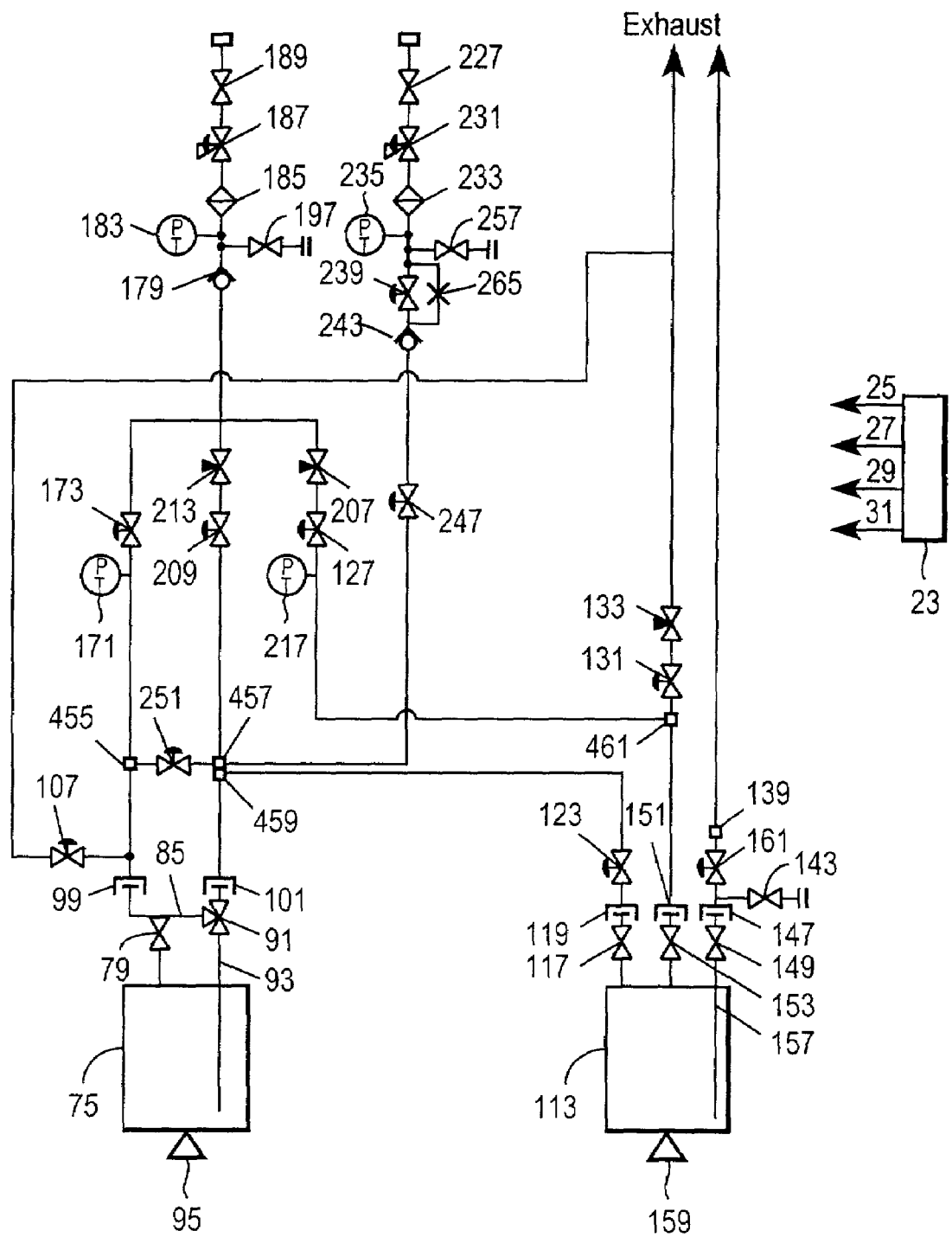
FIG. 18 is a schematic diagram of interconnections of different blocks in a delivery system with purge gas.

With another preferred embodiment as shown in FIG. 18, a purge gas block is added into the embodiment in FIG. 17. The purge gas block connects to the chemical container block at points 455 and 457. When the chemical line needs to be purged, the control valve 247 will be on to allow inert purge gas flow into the chemical line. Purge gas will then flow through the block valve 91 that is open to the by-pass line 85 in FIG. 8, and then exhausted through the exhaust control valve 107. Before the chemical container is disconnected from the joints 99 and 101, purge gas could be introduced into both the chemical line and the gas inlet conduit by turning on the control valves 247 and 251. The control valve 239 in the purge gas block could be closed. After the chemical container is disconnected, purge gas is continuously bleeding out from the disconnected joints 99 and 101 to blank ambient air. The by-pass orifice 265 allows inert gas bleeding out the joints at a flow rate that is not too low to let ambient air diffuse into the chemical lines, and not too high to waste too much inert gas.

Figure 19:
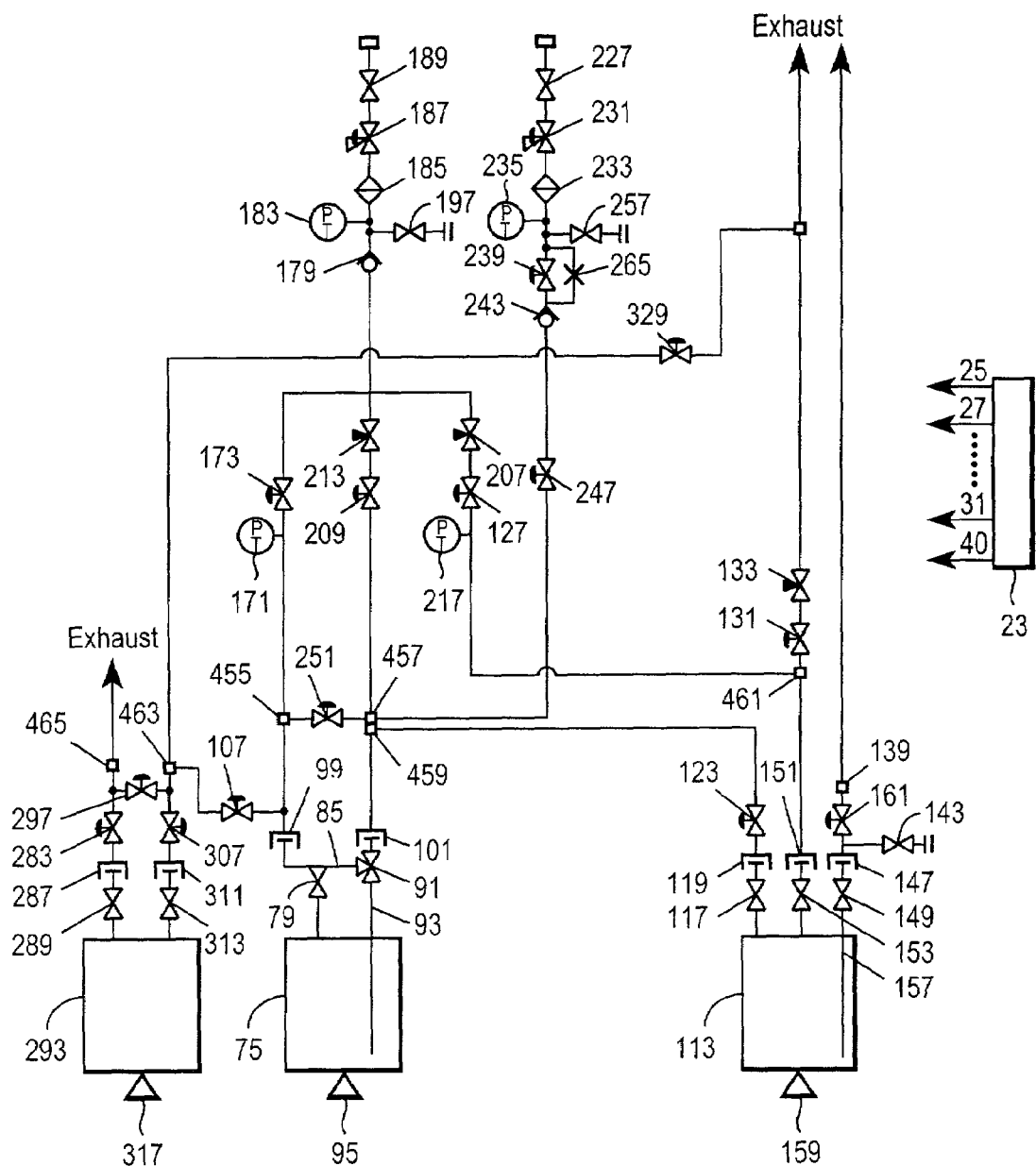
FIG. 19 is a schematic diagram of interconnections of different blocks in a delivery system with purge gas and waste recovery blocks.

FIG. 19 is a preferred chemical delivery system with an optional waste recovery block. Chemical container block is connected with the waste recovery block at the point 463, and the connection joint 279 of the waste recovery block as in FIG. 12 is connected with an exhaust line at the point 465. When the chemical container needs to be exhausted, the control valve 107 and the control valve 297 will be turned on to allow any gas exhausted to the exhaust line. In the case the residual chemicals inside the chemical to be purged, the control valves 107, the control valve 307, and the control valve 283 will be on. Chemical waste could be pressurized and pushed out of the chemical line to the waste container by either high-pressure purge gas by turning on the valve 247 or by the pressurization gas by turning on the control valve 209. Once the waste container is full, the control valves 283 and 307 will be in close position. Operator will manually turn off the isolation valves 289 and 313 and disconnect the container from the joints 287 and 311 for replacement. An empty waste container can be reconnected to the joints for continuous operation.

Figure 20:
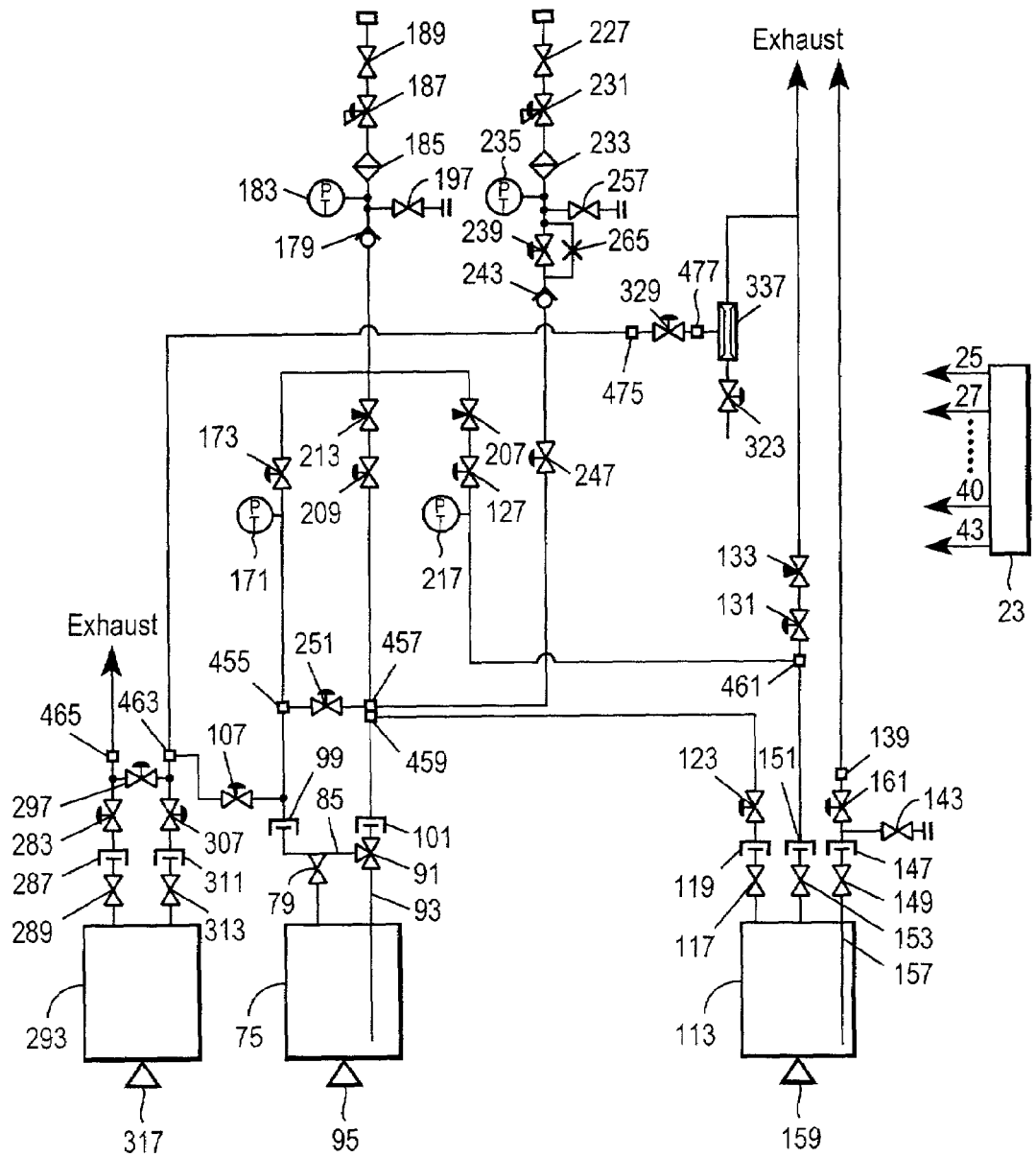
FIG. 20 is a schematic diagram of interconnections of different blocks in a delivery system with purge gas, waste recovery, and vacuum blocks.

FIG. 20 is a preferred embodiment with a vacuum block. A vacuum block as in FIG. 13 can be connected to the chemical container block at the point 463. Vacuum is provided when the chemical line needs to be cleaned and purged. For example, the chemical line needs to be purged by purge gas and vacuum alternatively to clean the line for impurities after a chemical container is connected to the delivery manifold at the joints 99 and 101. The chemical line can be purged with purge gas by turning on the control valve 247 to let purge gas flow from the chemical line through the isolation valve 91 to by-pass line 85, the control valve 107, control valve 297 and to exhaust. The line can be vacuumed by turning on the vacuum control valve 329. At this time, the control valves 247 and 297 are closed. The line can be purged in such a kind of cycling method for up to 50 times, even more times if necessary. The line will be vacuumed in a last purge step. The isolation valve 91 can be turned on to the container side to allow chemical flow into the chemical line for delivery or recharging the recharging container.

Figure 21:
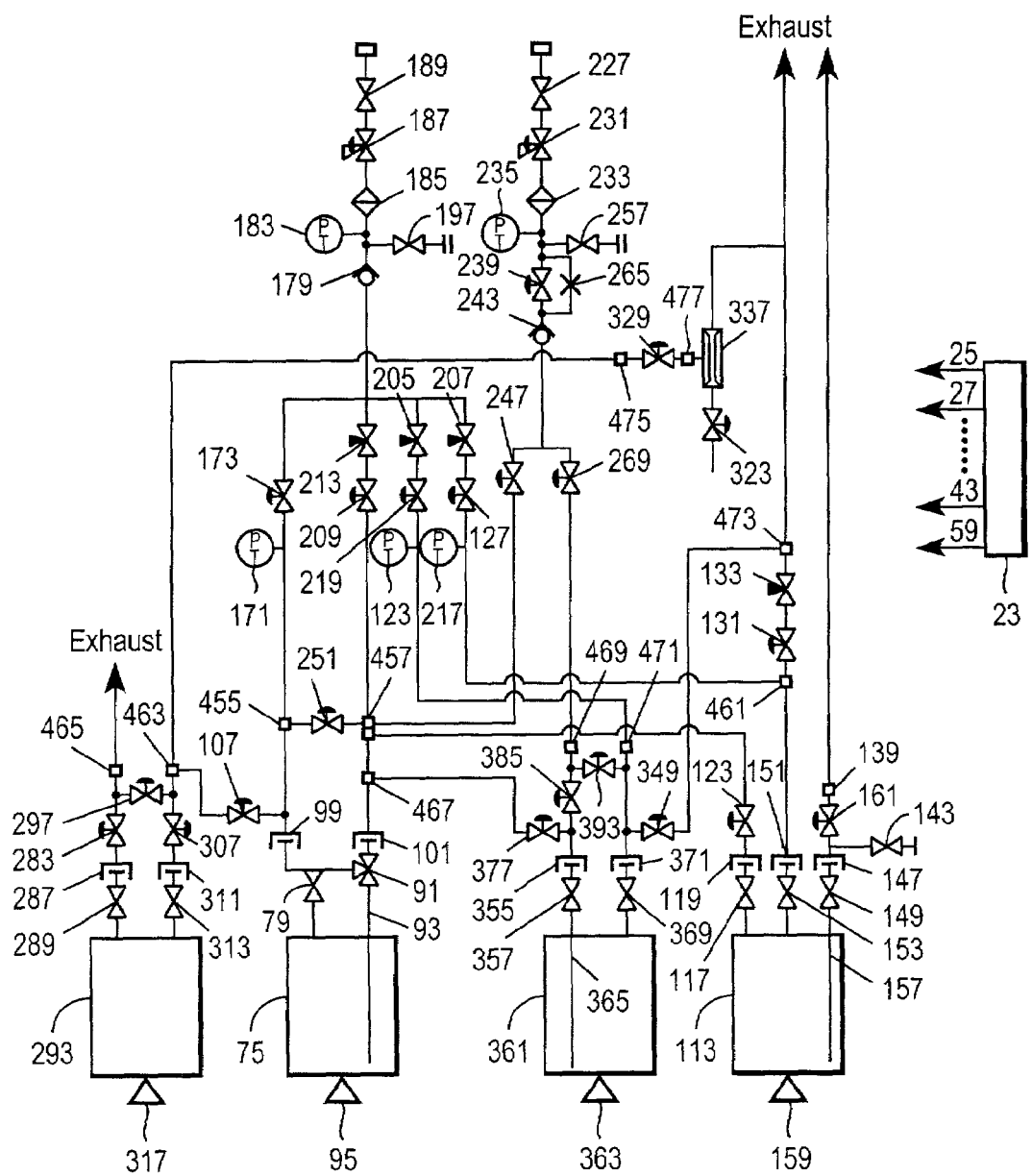
FIG. 21 is a schematic diagram of interconnections of different blocks in a delivery system with purge gas, waste recovery, vacuum, and solvent supplying blocks.

FIG. 21 is a preferred embodiment with an optional solvent supply block to supply liquid solvent for system cleaning and purging. The solvent supply block is connected to the chemical container block at the point 467 for supplying solvent to the chemical line for purging. The solvent supply block is connected to pressurization gas block at the point 471 for pressurization gas to the solvent container. The solvent supply block could be further connected to the purge gas block at the point 469 for purge gas. The exhaust line of the solvent supply block is connected to an exhaust line at the point 473. In a normal operation, the solvent container is pressurized for solvent delivery. When the solvent is demanded for purging, the control valve 377 is turned on automatically by the signal from the control block 23. Liquid solvent with dissolved residual chemical flow through the isolation valve 91, the control valve 107, and the control valve 307 into the waste recovery container 293. When the solvent container is empty or the solvent level reaches its low level, the automatic control block will warn the operator to replace the solvent container and close the solvent control valve 377. The pressurization gas control valve 219 is closed automatically by the automatic control block 23. The exhaust control valve 349 is then turned on also automatically to release the pressure inside the solvent container. Either pressurization gas or purge gas could be supplied to the solvent conduit to push the solvent inside the conduit between the control valves 377 and 385 and the isolation valve 369 back into the container. When the purge gas is used for line cleaning, the control valve 269 in the purge gas block, the control valve 385, and the isolation valve 369 are open. When the pressurization gas is used for line cleaning, the isolation valve 357 is closed, the by-pass valve 393, control valve 385, and the isolation valve 369 are open. After line cleaning, purge gas is supplied into the gas inlet and solvent outlet conduits. The solvent container is then disconnected from the joints 355 and 371 while the isolation valves 357 and 369 are closed. The purge gas then bleeds out from the opened joints to blank ambient contaminates.

Figure 22:
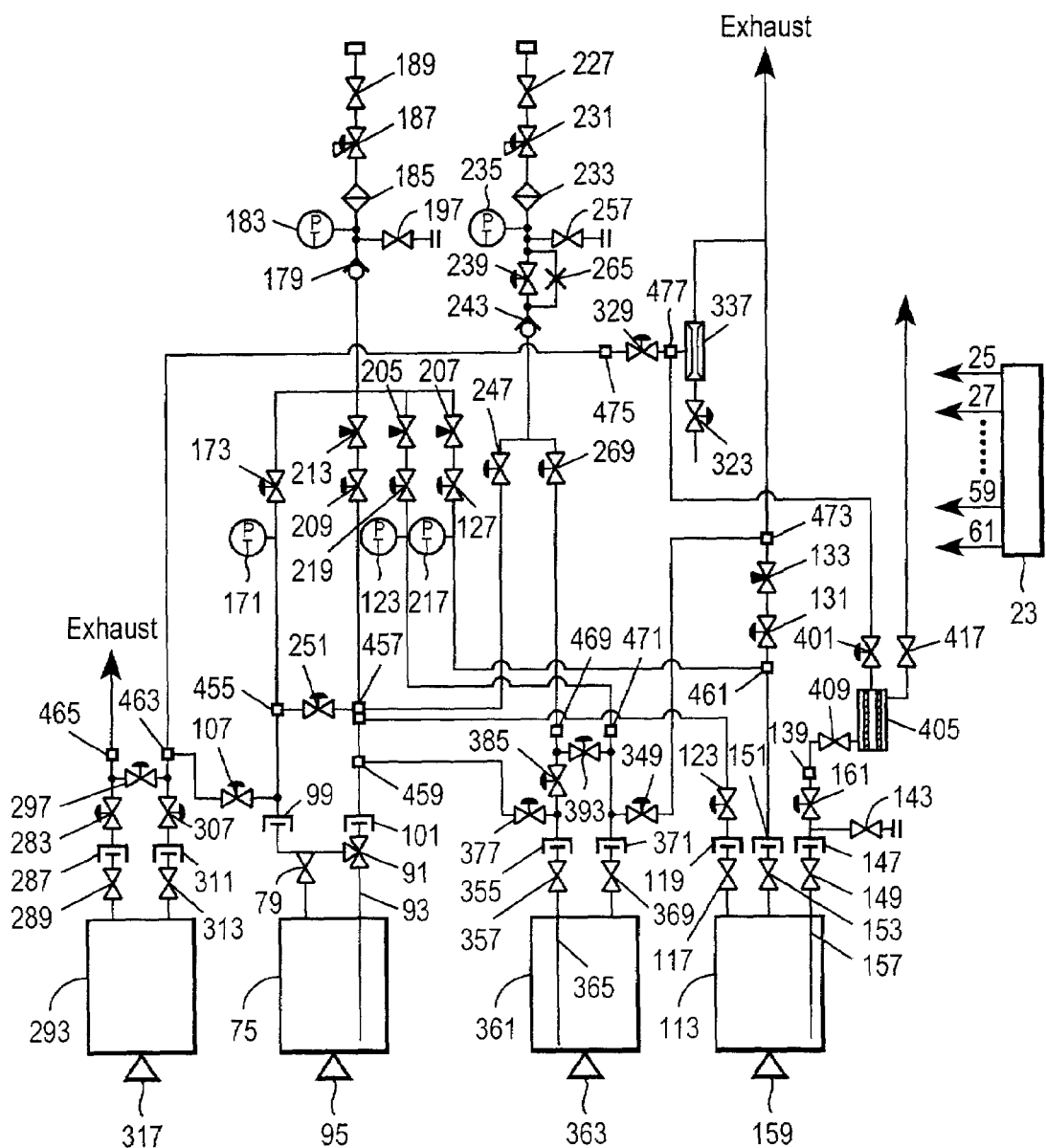
FIG. 22 is a schematic diagram of interconnections of different blocks in a delivery system with purge gas, waste recovery, vacuum, solvent supplying, and degassing blocks.

FIG. 22 is a preferred embodiment of chemical delivery system with a degassing block to remove dissolved gas in chemicals. As shown, the degas block is connected with the recharge block at the point 139 and the vacuum block at the point 477. Chemical from the recharge container flows through a membrane cartridge 405 to user tools. The control valves 161 before the degas block and the control valve 417 after the block can be closed if there is no need for chemicals or the degas block should be repaired. The control valve 401 in the vacuum line could be tuned on for vacuum or off for repair reason. The degas block could also be connected to the chemical container block before the recharge block for degassing.

Figure 23:
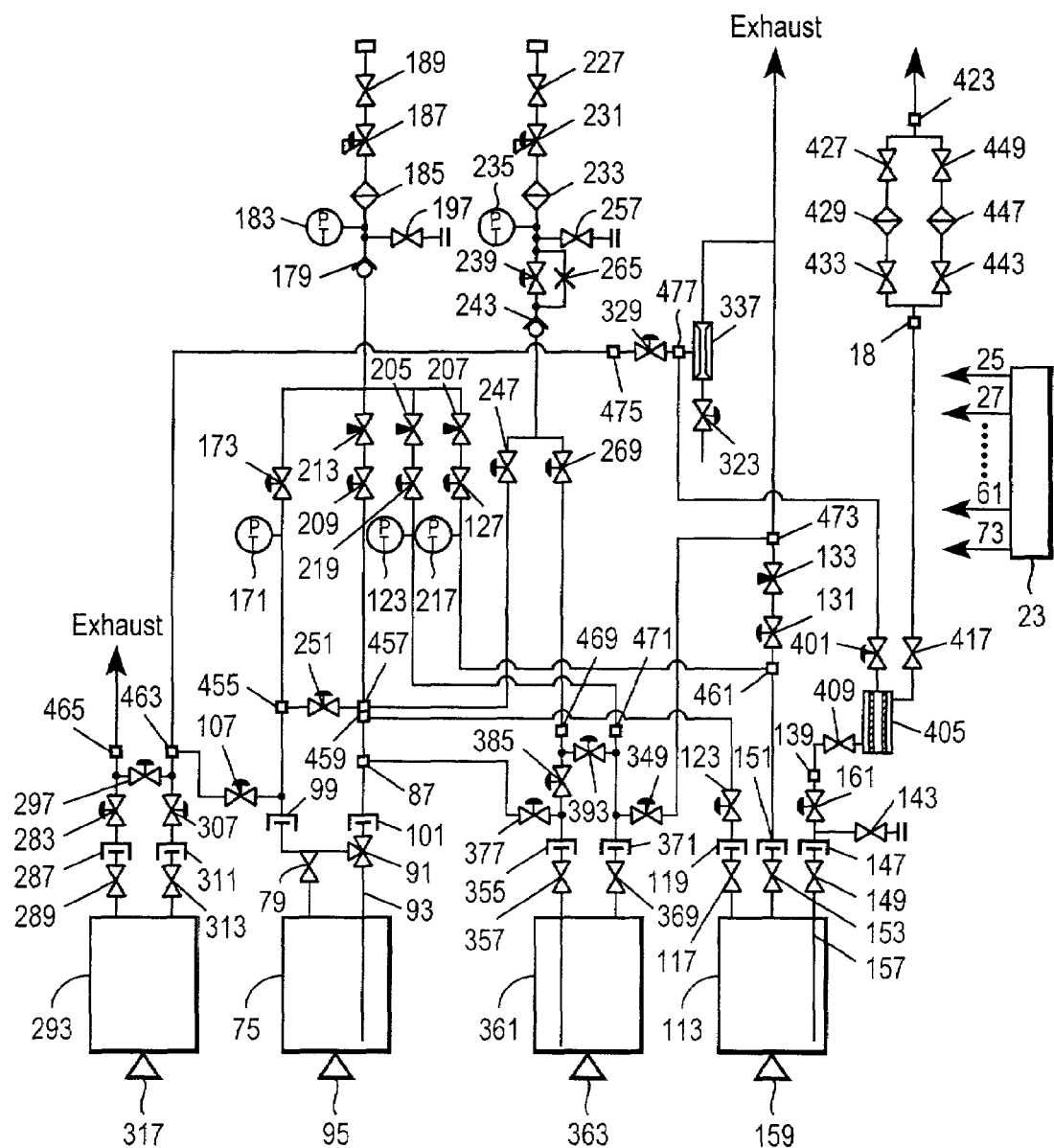
FIG. 23 is a schematic diagram of interconnections of different blocks in a delivery system with purge gas, waste recovery, vacuum, solvent supplying, degassing, and filtration blocks.

FIG. 23 is a preferred embodiment of chemical delivery system with a filtration block. The block is connected to the degas block in the chemical line at the point 18. Although one filter services the filtration requirement well, it is preferred to have two filters installed in parallel as in the Figure. In a normal operation, one filter may be used and another is in spare. When a filter is changed after a period of time, the isolation valves before and after the filter are closed manually by operator. Introducing purge gas and liquid solvent if necessary could purge the chemical inside the filter. After installing a new filter, the filter and the connections should be cleaned and purged before introducing chemicals into the line.

While the invention has been described in detail with reference to specific embodiments thereof, it will be apparent to one skilled in the art that various changes and modifications can be made, and equivalents employed, without departing from the scope of the appended claims.

The invention claimed is:

1. A chemical delivery system for delivering an ultrapure chemical to a point of use, comprising:
   a chemical container apparatus comprising a sealed chemical container adapted for containing an ultrapure chemical;
   a recharge container apparatus comprising a recharge container adapted for containing the ultrapure chemical after receipt of the ultrapure chemical from the chemical container apparatus;
   a source of a high pressure inert gas;
   a pressurization gas apparatus adapted to receive the high pressure inert gas and deliver the high pressure inert gas to the chemical container apparatus and the recharge container apparatus;
   a first connection joint between and in fluid communication with the chemical container apparatus and the pressurization gas apparatus;
   a second connection joint between and in fluid communication with the chemical container apparatus and the recharge container apparatus;
   a third connection joint between and in fluid communication with the recharge container apparatus and pressurization gas apparatus;
   a source of a purge gas, wherein the purge gas is the same as or different from the high pressure inert gas;
   a purge gas apparatus adapted to receive the purge gas and deliver the purge gas to the chemical container apparatus;
   a fourth connection joint between and in fluid communication with the chemical container apparatus and the purge gas apparatus;
   a vacuum apparatus adapted to create a vacuum;

a fifth connection joint between and in fluid communication between the vacuum apparatus and either the chemical container apparatus or the recharge container apparatus, a solvent supply apparatus adapted to receive the high pressure inert gas from the pressurization gas apparatus and thereby pressurize a solvent and being further adapted to supply the pressurized solvent to the chemical container apparatus;

a sixth connection joint between and in fluid communication with the pressurization gas apparatus and the solvent supply apparatus; and a seventh connection joint between and in fluid communication with the solvent supply apparatus and the chemical container apparatus.

2. The chemical delivery system of claim 1, wherein the chemical container apparatus comprises a chemical container gas inlet conduit extending between and in fluid communication between the first connection joint and the sealed chemical container, a chemical container chemical outlet conduit extending between and in fluid communication between the sealed chemical container and the second connection joint, a chemical container bypass conduit extending between and in fluid communication with the chemical container gas inlet and outlet conduits, a chemical container discharge conduit, and a chemical container level indicator adapted to monitor a level of ultrapure chemical when the ultrapure chemical is present in the sealed chemical container, wherein:

the chemical container gas inlet conduit comprises:
 a first chemical container disconnection joint in fluid communication with the first connection joint, and
 a first chemical container isolation valve in fluid communication between the first connection joint and the sealed container;

the chemical container chemical outlet conduit comprises:
 a second chemical container disconnection joint in fluid communication with the second connection joint, the first and second chemical container disconnection joints being adapted to allow the sealed chemical container to be reversibly removed from the chemical delivery system,
 a chemical container diptube with a first end extending into the sealed chemical container, and
 a second chemical container isolation valve in fluid communication between the second chemical container disconnection joint and a second end of the chemical container diptube; and the chemical container discharge conduit comprises:
 a chemical container waste outlet conduit,
 a chemical container waste inlet conduit in fluid communication with either or both of the chemical container gas inlet conduit and the chemical container chemical outlet conduit, and
 a chemical container control valve in fluid communication between the chemical container waste inlet and outlet conduits.

3. The chemical delivery system of claim 1, wherein:
the recharge container apparatus comprises
 a recharge container chemical inlet conduit extending between and in fluid communication between the second connection joint and the sealed recharge container,
 a recharge container gas inlet conduit extending between and in fluid communication between the second connection joint and the sealed recharge container,
 a recharge container chemical delivery conduit extending between and in fluid communication with the sealed recharge container,
 a recharge container level monitor associated with the sealed recharge container adapted to monitor a level of ultrapure chemical when it is present in the sealed recharge container, and
 a recharge container gas discharge conduit;

the recharge container chemical inlet conduit comprises
 a first recharge container control valve in fluid communication with the second connection joint,
 a first recharge container isolation valve in fluid communication with the sealed recharge container,
 a first recharge container disconnection joint in fluid communication between the first recharge container control valve and the first recharge container isolation valve;

the recharge container gas inlet conduit comprises
 a second recharge container isolation valve in fluid communication with the sealed recharge container, and
 a second recharge container disconnection joint in fluid communication between the second recharge container control valve and the third connection joint;

the recharge container chemical delivery conduit comprises, in order
 a diptube with a first end extending into the sealed recharge container
 a third recharge container isolation valve,
 a third recharge container disconnection joint, wherein the first, second, and third recharge container disconnection joints are adapted to allow the sealed container to be reversibly removed from the chemical delivery system; and the recharge container gas discharge conduit comprises, in order:
 a second recharge container control valve in fluid communication with the recharge container gas inlet conduit at a point between the third connection joint and second recharge container disconnection joint, and
 a needle valve.

4. The chemical delivery system of claim 1, further comprising a waste recovery apparatus, an eighth connection joint in fluid communication between the chemical container apparatus and the waste recovery apparatus, and an exhaust line, wherein:

the waste recovery apparatus comprises
 a sealed waste recovery container,
 a waste recovery inlet in fluid communication with and extending between the eighth connection joint and the sealed waste recovery container,
 a waste recovery outlet extending between and in fluid communication with the exhaust line and the sealed waste container,
 a waste recovery bypass conduit extending between and in fluid communication between the waste recovery inlet and outlet conduits;

the waste recovery inlet comprises, in order from the eighth connection joint to the sealed waste recovery container
 a first waste recovery control valve,
 a first waste recovery disconnection joint, and
 a first waste recovery isolation valve; and the waste recovery exhaust comprises, in order from the sealed waste recovery container to the exhaust line
 a second waste recovery isolation valve, a second waste recovery disconnection joint, wherein the first and second waste recovery disconnection joints are adapted to allow the sealed waste recovery container to be reversibly removed from the chemical delivery system, and a second waste recovery control valve.

5. The chemical delivery system of claim 1, wherein the vacuum apparatus is in fluid communication with one, two, three, or all four of the chemical container apparatus, the recharge container apparatus, the solvent supply apparatus, and the waste recovery apparatus.

6. The chemical delivery system of claim 1, further comprising an exhaust line, a degassing apparatus in fluid communication with the exhaust, and an eighth connection joint in fluid communication between the recharge container apparatus and the degas apparatus, wherein the degas apparatus comprises:

a degas chemical inlet conduit, a membrane adapted to separate dissolved gas from liquid in ultrapure chemical flowing from the degas chemical inlet and through the membrane, the degas chemical inlet conduit being in fluid communication between the eighth connection joint to the membrane, a degassing chemical outlet conduit adapted to receive degassed ultrapure chemical from the membrane, and a degassing exhaust conduit extending between and in fluid communication with the membrane and the exhaust line, the degas exhaust conduit being adapted to receive gas separated from the ultrapure chemical by the membrane.

7. The chemical delivery system of claim 1, wherein the recharge container chemical delivery conduit is adapted to delivery ultrapure chemical to a vaporizer.

8. The chemical delivery system of claim 1, wherein the vacuum generator is a venturi or a vacuum pump.

9. The chemical delivery system of claim 1, further comprising a tenth connection joint in fluid communication with a filtration apparatus, wherein:

the tenth connection joint is in fluid communication between the filtration apparatus and either the recharge container apparatus or the degassing apparatus; and the filtration apparatus comprises:
a filtration chemical inlet,
a first filtration chemical inlet conduit,
a second filtration chemical inlet conduit,
a first upstream filtration isolation valve, the first filtration chemical inlet conduit being in fluid communication between the filtration chemical inlet and the first upstream filtration isolation valve,
a second upstream filtration isolation valve, the second filtration chemical inlet conduit being in fluid communication between the filtration chemical inlet and the second upstream filtration isolation valve,
a first filter,
a second filter,
a first downstream filtration isolation valve, the first filter being in fluid communication between the first upstream filtration isolation valve and the first downstream filtration isolation valve,
a second downstream filtration isolation valve, the second filter being in fluid communication between the second upstream filtration isolation valve and the second downstream filtration isolation valve,
a first filtration chemical outlet conduit,
a second filtration chemical outlet conduit, and
a filtration chemical outlet, the first filtration chemical outlet conduit being in fluid communication between the first downstream filtration isolation valve and the filtration chemical outlet, the second filtration chemical outlet conduit being in fluid communication between the second downstream filtration isolation valve and the filtration chemical outlet.

10. The chemical delivery system of claim 1, wherein the purge and pressurization gases are not the same.

11. The chemical delivery system of claim 2, further comprising an exhaust line, a degassing apparatus in fluid communication with the exhaust, and an eighth connection joint in fluid communication between the recharge container apparatus and the degas apparatus, wherein the degas apparatus comprises:

a degas chemical inlet conduit, a membrane adapted to separate dissolved gas from liquid in ultrapure chemical flowing from the degas chemical inlet and through the membrane, the degas chemical inlet conduit being in fluid communication between the eighth connection joint to the membrane, a degassing chemical outlet conduit adapted to receive degassed ultrapure chemical from the membrane, and a degassing exhaust conduit extending between and in fluid communication with the membrane and the exhaust line, the degas exhaust conduit being adapted to receive gas separated from the ultrapure chemical by the membrane.

12. The chemical delivery system of claim 3, further comprising an exhaust line, a degassing apparatus in fluid communication with the exhaust, and an eighth connection joint in fluid communication between the recharge container apparatus and the degas apparatus, wherein the degas apparatus comprises:

a degas chemical inlet conduit, a membrane adapted to separate dissolved gas from liquid in ultrapure chemical flowing from the degas chemical inlet and through the membrane, the degas chemical inlet conduit being in fluid communication between the eighth connection joint to the membrane, a degassing chemical outlet conduit adapted to receive degassed ultrapure chemical from the membrane, and a degassing exhaust conduit extending between and in fluid communication with the membrane and the exhaust line, the degas exhaust conduit being adapted to receive gas separated from the ultrapure chemical by the membrane.

13. The chemical delivery system of 4, further comprising an exhaust line, a degassing apparatus in fluid communication with the exhaust, and an eighth connection joint in fluid communication between the recharge container apparatus and the degas apparatus, wherein the degas apparatus corn prises:

a degas chemical inlet conduit, a membrane adapted to separate dissolved gas from liquid in ultrapure chemical flowing from the degas chemical inlet and through the membrane, the degas chemical inlet conduit being in fluid communication between the eighth connection joint to the membrane, a degassing chemical outlet conduit adapted to receive degassed ultrapure chemical from the membrane, and a degassing exhaust conduit extending between and in fluid communication with the membrane and the exhaust line, the degas exhaust conduit being adapted to receive gas separated from the ultrapure chemical by the membrane.

14. The chemical delivery system of claim 2, further comprising an eighth connection joint in fluid communication with a filtration apparatus, wherein:

the eighth connection joint is in fluid communication between the filtration apparatus and either the recharge container apparatus or a degassing apparatus; and the filtration apparatus comprises, in order from the eighth connection joint, a filtration chemical inlet, at least one filter, and a filtration chemical outlet.

15. The chemical delivery system of claim 3, further comprising an eighth connection joint in fluid communication with a filtration apparatus, wherein:

the eighth connection joint is in fluid communication between the filtration apparatus and either the recharge container apparatus or a degassing apparatus; and the filtration apparatus comprises, in order from the eighth connection joint, a filtration chemical inlet, at least one filter, and a filtration chemical outlet.

16. The chemical delivery system of 4, further comprising an eighth connection joint in fluid communication with a filtration apparatus, wherein:

the eighth connection joint is in fluid communication between the filtration apparatus and either the recharge container apparatus or a degassing apparatus; and the filtration apparatus comprises, in order from the eighth connection joint, a filtration chemical inlet, at least one filter, and a filtration chemical outlet.

17. The chemical delivery system of claim 11, further comprising a ninth connection joint in fluid communication with a filtration apparatus, wherein:

the ninth connection joint is in fluid communication between the filtration apparatus and either the recharge container apparatus or the degassing apparatus; and the filtration apparatus comprises, in order from the ninth connection joint, a filtration chemical inlet, at least one filter, and a filtration chemical outlet.

18. The chemical delivery system of claim 12, further comprising a ninth connection joint in fluid communication with a filtration apparatus, wherein:

the ninth connection joint is in fluid communication between the filtration apparatus and either the recharge container apparatus or the degassing apparatus; and the filtration apparatus comprises, in order from the ninth connection joint, a filtration chemical inlet, at least one filter, and a filtration chemical outlet.

19. The chemical delivery system of claim 13, further comprising a ninth connection joint in fluid communication with a filtration apparatus, wherein:

the ninth connection joint is in fluid communication between the filtration apparatus and either the recharge container apparatus or the degassing apparatus; and the filtration apparatus comprises, in order from the ninth connection joint, a filtration chemical inlet, at least one filter, and a filtration chemical outlet.

20. A chemical delivery system for delivering an ultrapure chemical to a point of use, comprising:

a chemical container apparatus comprising a sealed chemical container adapted for containing an ultrapure chemical;

a recharge container apparatus comprising a recharge container adapted for containing the ultrapure chemical after receipt of the ultrapure chemical from the chemical container apparatus;

a source of a high pressure inert gas;

a pressurization gas apparatus adapted to receive the high pressure inert gas and deliver the high pressure inert gas to the chemical container apparatus and the recharge container apparatus;

a first connection joint between and in fluid communication with the chemical container apparatus and the pressurization gas apparatus;

a second connection joint between and in fluid communication with the chemical container apparatus and the recharge container apparatus;

a third connection joint between and in fluid communication with the recharge container apparatus and pressurization gas apparatus;

a source of a purge gas, wherein the purge gas is the same as or different from the high pressure inert gas;

a purge gas apparatus adapted to receive the purge gas and deliver the purge gas to the chemical container apparatus;

a fourth connection joint between and in fluid communication with the chemical container apparatus and the purge gas apparatus;

a vacuum apparatus adapted to create a vacuum;

a fifth connection joint between and in fluid communication between the vacuum apparatus and either the chemical container apparatus or the recharge container apparatus, a solvent supply apparatus adapted to receive the high pressure inert gas from the pressurization gas apparatus and thereby pressurize a solvent and being further adapted to supply the pressurized solvent to the chemical container apparatus;

a sixth connection joint between and in fluid communication with the pressurization gas apparatus and the solvent supply apparatus;

a seventh connection joint between and in fluid communication with the solvent supply apparatus and the chemical container apparatus; and an eighth connection joint in fluid communication with a filtration apparatus, wherein:

the eighth connection joint is in fluid communication between the filtration apparatus and either the recharge container apparatus or a degassing apparatus; and the filtration apparatus comprises, in order from the eighth connection joint, a filtration chemical inlet, at least one filter, and a filtration chemical outlet.

* * * * *